(12) United States Patent
Wang et al.

(10) Patent No.: US 12,433,124 B2
(45) Date of Patent: Sep. 30, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Benlian Wang, Beijing (CN); Hongjun Zhou, Beijing (CN); Wei Zhang, Beijing (CN); Weiyun Huang, Beijing (CN); Ming Hu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 628 days.

(21) Appl. No.: 17/780,825

(22) PCT Filed: May 27, 2021

(86) PCT No.: PCT/CN2021/096385
§ 371 (c)(1),
(2) Date: May 27, 2022

(87) PCT Pub. No.: WO2022/052514
PCT Pub. Date: Mar. 17, 2022

(65) Prior Publication Data
US 2023/0006005 A1    Jan. 5, 2023

(30) Foreign Application Priority Data

Sep. 10, 2020  (WO) ................ PCT/CN2020/114619
Sep. 29, 2020  (WO) ................ PCT/CN2020/118991
Mar. 31, 2021  (CN) .......................... 202110351540.4

(51) Int. Cl.
*H10K 59/35* (2023.01)

(52) U.S. Cl.
CPC ......... *H10K 59/353* (2023.02); *H10K 59/351* (2023.02); *H10K 59/352* (2023.02)

(58) Field of Classification Search
CPC .. H10K 59/353; H10K 59/351; H10K 59/352; H10K 59/12
See application file for complete search history.

(56) References Cited

U.S. PATENT DOCUMENTS 8,994,015 B2  3/2015  Pyon et al.
9,697,760 B2  7/2017  Wang
(Continued)

FOREIGN PATENT DOCUMENTS

CN    104051493 A    9/2014
CN    104282727 A    1/2015
(Continued)

OTHER PUBLICATIONS

Translation of CN 109300958 A, Wang, Bo, A Pixel Structure, Display Panel And Display Device (Year: 2019).*
(Continued)

*Primary Examiner* — Jacob Y Choi
*Assistant Examiner* — Ashley Nicole Blackwell
(74) *Attorney, Agent, or Firm* — Scully, Scott, Murphy & Presser, P.C.

(57) ABSTRACT

A display substrate and a display device are provided. The display substrate includes a first sub-pixel, a second sub-pixel and a third sub-pixel; each sub-pixel includes a light-emitting region; in at least one of the first sub-pixel, the second sub-pixel and the third sub-pixel, vertex angles of the light-emitting region include a first corner and a second corner opposite to each other; a distance from an intersection of the extension lines or tangents of two sides forming the
(Continued)

first corner to a center of the sub-pixel is greater than a distance from an intersection of two sides forming the second corner or the extension lines or tangents thereof to the center; the sub-pixel includes a first-type sub-pixel and a second-type sub-pixel; and in different types of sub-pixels, the direction of the vertex of the first corner pointing to the vertex of the second corner is different.

18 Claims, 19 Drawing Sheets

(56) References Cited

U.S. PATENT DOCUMENTS

| | | | |
|---|---|---|---|
| 10,446,618 B2 | 10/2019 | Wang et al. | |
| 10,680,041 B2 | 6/2020 | Li et al. | |
| 10,720,481 B2 | 7/2020 | Xiao et al. | |
| 10,937,848 B2 | 3/2021 | Park et al. | |
| 11,114,016 B2 | 9/2021 | Liu et al. | |
| 11,189,665 B2 | 11/2021 | Zhang et al. | |
| 11,562,689 B2 | 1/2023 | Ueno | |
| 2005/0248262 A1 | 11/2005 | Elliott | |
| 2012/0033160 A1 | 2/2012 | Tashiro et al. | |
| 2013/0113363 A1 | 5/2013 | Hong | |
| 2013/0234917 A1 | 9/2013 | Lee | |
| 2014/0319479 A1 | 10/2014 | Park et al. | |
| 2014/0319484 A1 | 10/2014 | Kwon | |
| 2015/0015465 A1 | 1/2015 | Gong | |
| 2015/0123952 A1 | 5/2015 | Kim et al. | |
| 2015/0379924 A1* | 12/2015 | Matsueda | H10K 59/352 345/77 |
| 2016/0071910 A1 | 3/2016 | Sasaki et al. | |
| 2016/0078807 A1 | 3/2016 | Sun et al. | |
| 2016/0253943 A1 | 9/2016 | Wang | |
| 2017/0194398 A1 | 7/2017 | Kim et al. | |
| 2017/0317150 A1 | 11/2017 | Chung et al. | |
| 2018/0088260 A1 | 3/2018 | Jin et al. | |
| 2018/0130838 A1 | 5/2018 | Tian et al. | |
| 2018/0158887 A1 | 6/2018 | Yun et al. | |
| 2018/0254304 A1 | 9/2018 | Hong et al. | |
| 2018/0261654 A1 | 9/2018 | Hwang et al. | |
| 2018/0277040 A1 | 9/2018 | Lee et al. | |
| 2018/0342570 A1 | 11/2018 | Hong et al. | |
| 2019/0140030 A1* | 5/2019 | Huangfu | H10K 59/122 |
| 2019/0252469 A1 | 8/2019 | Xiao et al. | |
| 2019/0355794 A1 | 11/2019 | Dai et al. | |
| 2019/0363310 A1 | 11/2019 | Nakamura | |
| 2019/0393275 A1 | 12/2019 | Kim et al. | |
| 2020/0127060 A1 | 4/2020 | Li et al. | |
| 2020/0168692 A1 | 5/2020 | Liu et al. | |
| 2020/0273924 A1 | 8/2020 | Xiao et al. | |
| 2020/0343318 A1 | 10/2020 | Li et al. | |
| 2020/0357862 A1 | 11/2020 | Wang et al. | |
| 2020/0402442 A1 | 12/2020 | Liu et al. | |
| 2021/0091145 A1 | 3/2021 | Huangfu et al. | |
| 2021/0098539 A1 | 4/2021 | Zhang et al. | |
| 2021/0098540 A1 | 4/2021 | Chen | |
| 2021/0193766 A1 | 6/2021 | Liu et al. | |
| 2021/0335909 A1 | 10/2021 | Wang et al. | |
| 2021/0343800 A1 | 11/2021 | Zhao | |
| 2021/0343801 A1 | 11/2021 | Wang et al. | |
| 2022/0069027 A1 | 3/2022 | Wang et al. | |
| 2022/0208890 A1 | 6/2022 | Liu et al. | |
| 2022/0208891 A1 | 6/2022 | Liu et al. | |
| 2022/0310711 A1 | 9/2022 | Liu et al. | |
| 2022/0328573 A1 | 10/2022 | Hu et al. | |
| 2022/0336539 A1 | 10/2022 | Luo et al. | |
| 2022/0336543 A1 | 10/2022 | Liu et al. | |
| 2022/0352259 A1 | 11/2022 | Xue et al. | |
| 2022/0399530 A1 | 12/2022 | Han et al. | |
| 2023/0006004 A1 | 1/2023 | Li et al. | |
| 2023/0081009 A1 | 3/2023 | Shi et al. | |
| 2023/0087603 A1 | 3/2023 | Wang et al. | |

FOREIGN PATENT DOCUMENTS

| | | | | |
|---|---|---|---|---|
| CN | 204885167 U | | 12/2015 | |
| CN | 205355055 U | | 6/2016 | |
| CN | 106486514 A | | 3/2017 | |
| CN | 107887404 A | | 4/2018 | |
| CN | 207966983 U | | 10/2018 | |
| CN | 207966985 U | | 10/2018 | |
| CN | 207966988 U | | 10/2018 | |
| CN | 207966995 U | | 10/2018 | |
| CN | 108922919 A | | 11/2018 | |
| CN | 208077981 U | | 11/2018 | |
| CN | 109300958 A | * | 2/2019 | ......... H01L 27/3218 |
| CN | 109860237 A | | 6/2019 | |
| CN | 109935617 A | | 6/2019 | |
| CN | 208970513 U | | 6/2019 | |
| CN | 109994503 A | | 7/2019 | |
| CN | 110137206 A | | 8/2019 | |
| CN | 110364557 A | | 10/2019 | |
| CN | 110620135 A | | 12/2019 | |
| CN | 111341815 A | | 6/2020 | |
| CN | 111341817 A | | 6/2020 | |
| CN | 111682056 A | | 9/2020 | |
| CN | 111725289 A | | 9/2020 | |
| CN | 111799320 A | | 10/2020 | |
| CN | 112368840 A | | 2/2021 | |
| CN | 112436029 A | | 3/2021 | |
| CN | 112436030 A | | 3/2021 | |
| CN | 112470287 A | | 3/2021 | |
| CN | 112864215 A | | 5/2021 | |
| CN | 111416048 B | | 9/2022 | |
| JP | 2005352140 A | | 12/2005 | |
| JP | 2015206988 A | | 11/2015 | |
| KR | 20200060861 A | | 6/2020 | |
| WO | 2022052010 A1 | | 3/2022 | |
| WO | 2022052390 A1 | | 3/2022 | |

OTHER PUBLICATIONS

Office Action dated Apr. 9, 2024 received in U.S. Appl. No. 17/439,940.
Extended European Search Report dated Dec. 8, 2023 received in European Patent Application No. EP 21865575.1.
Extended European Search Report dated Nov. 29, 2023 received in European Patent Application No. EP 21865889.6.
Office Action dated Feb. 7, 2024 received in U.S. Appl. No. 17/439,861.
Office Action dated Dec. 30, 2022 received in U.S. Appl. No. 17/850,172.
Notice of Reasons for Refusal dated Apr. 24, 2023 received in Japanese Patent Application No. JP 2021-577081.
Office Action dated Apr. 14, 2023 received in U.S. Appl. No. 17/850,172.
Notice of Reasons for Refusal dated Mar. 11, 2025 received in Japanese Patent Application No. 2023-140499.
Office Action dated May 28, 2025 received in United States U.S. Appl. No. 17/795,906.

* cited by examiner

DISPLAY SUBSTRATE AND DISPLAY DEVICE

CROSS-REFERENCE TO RELATED APPLICATIONS

This application is a national phase entry of PCT International Application No. PCT/CN2021/096385, filed on May 27, 2021, which claims priority of PCT International Application No. PCT/CN2020/118991, filed on Sep. 29, 2020, priority of PCT International Application No. PCT/CN2020/114619, filed on Sep. 10, 2020, and priority of Chinese Patent Application No. 202110351540.4, filed on Mar. 31, 2021, and the entire content disclosed of each of the above-identified PCT international applications and the above-identified Chinese patent application is incorporated herein by reference as part of the present application for all purposes.

TECHNICAL FIELD

At least one embodiment of the present disclosure relates to a display substrate and a display device.

BACKGROUND

Organic Light Emitting Diode (OLED) display device is a self-luminous device with a series of advantages such as high brightness, full viewing angle, fast response speed and flexible display. In an organic light emitting diode display device, the conventional arrangement of red sub-pixels, green sub-pixels and blue sub-pixels can be changed (for example, the virtual pixel method of reducing the number of sub-pixels by sharing part of sub-pixels), and the density of physical sub-pixels can be reduced on the premise of the same resolution of the image.

SUMMARY

At least one embodiment of the present disclosure provides a display substrate and a display device.

At least one embodiment of the present disclosure provides a display substrate including a plurality of sub-pixels. The plurality of sub-pixels include a plurality of first sub-pixels, a plurality of second sub-pixels and a plurality of third sub-pixels; the plurality of first sub-pixels and the plurality of third sub-pixels are alternately arranged along a row direction and a column direction to form a plurality of first pixel rows and a plurality of first pixel columns, the plurality of second sub-pixels are arrayed along the row direction and the column direction to form a plurality of second pixel rows and a plurality of second pixel columns, the plurality of first pixel rows and the plurality of second pixel rows are alternately arranged along the column direction, and the plurality of first pixel columns and the plurality of second pixel columns are alternately arranged along the row direction; taking centers of a certain first sub-pixel and a certain third sub-pixel adjacent to each other in a same first pixel row, and centers of one first sub-pixel and one third sub-pixel, which are in an adjacent first pixel row and are respectively adjacent to the certain first sub-pixel and the certain third sub-pixel adjacent to each other along the column direction, as four vertices of a virtual quadrilateral, one second sub-pixel is arranged in the virtual quadrilateral. The plurality of sub-pixels include a plurality of light emitting regions; in at least one kind of the first sub-pixels, the second sub-pixels and the third sub-pixels, vertex angles of the light emitting region include a first angle portion and a second angle portion which are oppositely arranged, and a distance between an intersection of extension lines or tangents of two sides constituting the first angle portion and a center of the sub-pixel is greater than a distance between an intersection of two sides constituting the second angle portion or extension lines or tangents of the two sides constituting the second angle portion and the center of the sub-pixel; the at least one kind of the first sub-pixels, the second sub-pixels and the third sub-pixels include a first type sub-pixel and a second type sub-pixel; in terms of different types of sub-pixels, directions in which a vertex of the first angle portion points to a vertex of the second angle portion are different; in the first type sub-pixel and the second type sub-pixel, the directions in which the vertex of the first angle portion points to the vertex of the second angle portion are a first direction and a second direction, respectively, and the first direction is opposite to the second direction.

For example, according to embodiments of the present disclosure, the at least one kind of the first sub-pixels, the second sub-pixels and the third sub-pixels further include a third type sub-pixel and a fourth type sub-pixel; in the third type sub-pixel and the fourth type sub-pixel, the directions in which the vertex of the first angle portion points to the vertex of the second angle portion are a third direction and a fourth direction, respectively, and the third direction is opposite to the fourth direction.

For example, according to embodiments of the present disclosure, the first sub-pixel, the second sub-pixel and the third sub-pixel are sub-pixels emitting light of different colors.

For example, according to embodiments of the present disclosure, in the at least one kind of the first sub-pixels, the second sub-pixels and the third sub-pixels, the vertex angles of the light emitting region further include a third angle portion and a fourth angle portion which are oppositely arranged; a connecting line between a vertex of the third angle portion and a vertex of the fourth angle portion divides the light emitting region into two parts, and shapes of the two parts are different.

For example, according to embodiments of the present disclosure, an area of one part in which the first angle portion is located is less than an area of one part in which the second angle portion is located.

For example, according to embodiments of the present disclosure, a shape of at least one of the third angle portion and the fourth angle portion is approximately the same as a shape of the second angle portion, and a distance between the vertex of the first angle portion and the connecting line is less than a distance between the vertex of the second angle portion and the connecting line.

For example, according to embodiments of the present disclosure, one of the first direction and the third direction is parallel to the row direction, and the other of the first direction and the third direction is parallel to the column direction.

For example, according to embodiments of the present disclosure, an included angle between the first direction and the third direction is in a range of 80-100 degrees.

For example, according to embodiments of the present disclosure, at least one of the plurality of first pixel rows includes a plurality of first pixel groups, each of the plurality of first pixel groups includes four first sub-pixels and four third sub-pixels, and each of the plurality of first pixel groups includes the first type sub-pixel, the second type sub-pixel, the third type sub-pixel and the fourth type sub-pixel.

For example, according to embodiments of the present disclosure, at least one of the plurality of first pixel columns includes a plurality of second pixel groups, each of the plurality of second pixel groups includes four first sub-pixels and four third sub-pixels, and each of the plurality of second pixel groups includes the first type sub-pixel, the second type sub-pixel, the third type sub-pixel and the fourth type sub-pixel.

For example, according to embodiments of the present disclosure, the first sub-pixels and the second sub-pixels are alternately arranged along an extending direction of a first diagonal line of the virtual quadrilateral, and the third sub-pixels and the second sub-pixels are alternately arranged along an extending direction of a second diagonal line of the virtual quadrilateral; sub-pixels arranged along the extending direction of one of the first diagonal line and the second diagonal line include a plurality of third pixel groups; each of the plurality of third pixel groups includes four first sub-pixels and four second sub-pixels, or four third sub-pixels and four second sub-pixels; and each of the plurality of third pixel groups includes the first type sub-pixel, the second type sub-pixel, the third type sub-pixel and the fourth type sub- pixel.

For example, according to embodiments of the present disclosure, sub-pixels arranged along the extending direction of the other of the first diagonal line and the second diagonal line include a plurality of fourth pixel groups; each of the plurality of fourth pixel groups includes two first sub-pixels and two second sub-pixels, or two third sub-pixels and two second sub-pixels; and each of the plurality of fourth pixel group includes two types of sub-pixels among the first type sub-pixel, the second type sub-pixel, the third type sub-pixels and the fourth type sub-pixel.

For example, according to embodiments of the present disclosure, at least one kind of the first sub-pixels and the third sub-pixels includes the first type sub-pixel, the second type sub-pixel, the third type sub-pixel and the fourth type sub-pixel; the first sub-pixel includes a red sub-pixel, and the third sub-pixel includes a blue sub-pixel.

For example, according to embodiments of the present disclosure, four third sub-pixels surrounding and adjacent to one first sub-pixel are the first type sub-pixel, the second type sub-pixel, the third type sub-pixel and the fourth type sub-pixel, respectively; and/or four first sub-pixels surrounding and adjacent to one third sub-pixel are the first type sub-pixel, the second type sub-pixel, the third type sub-pixel and the fourth type sub-pixel, respectively.

For example, according to embodiments of the present disclosure, the third sub-pixels include the first type sub-pixel, the second type sub-pixel, the third type sub-pixel and the fourth type sub-pixel; the light emitting region of the first sub-pixel includes four vertex angles, and shapes of the four vertex angles are approximately the same, and respective angle portions of the third sub-pixel and vertex angles of the first sub-pixels adjacent to the respective angle portions of the third sub-pixel respectively, are opposite to each other; a shortest distance between the first angle portion of the third sub-pixel and one vertex angle of the first sub-pixel which are adjacent to each other is greater than a shortest distance between any one of the other three angle portions of the third sub-pixel and one of vertex angles of the first sub-pixels adjacent to the any one of the other three angle portions of the third sub-pixel.

For example, according to embodiments of the present disclosure, in the third sub-pixel, a length of a first side connecting the first angle portion and the third angle portion is equal to a length of a second side connecting the first angle portion and the fourth angle portion; a length of a third side connecting the second angle portion and the third angle portion is equal to a length of a fourth side connecting the second angle portion and the fourth angle portion, and the length of the first side is less than the length of the third side.

For example, according to embodiments of the present disclosure, the light emitting region of the second sub-pixel includes fifth straight sides which are oppositely arranged and parallel to each other, and sixth straight sides which are oppositely arranged and parallel to each other, the fifth straight side is parallel to a straight side of the light emitting region of the third sub-pixel, and the sixth straight side is parallel to a straight side of the light emitting region of the first sub-pixel; a ratio of the length of the first side to a length of the fifth straight side is in a range of 0.7-1.5, and the length of the third side is greater than the length of the fifth straight side.

For example, according to embodiments of the present disclosure, the display substrate includes at least one display region, one first pixel row and one second pixel row located at an outermost edge of the at least one display region and adjacent to each other constitute an edge pixel row group, and one first pixel column and one second pixel column located at an outermost edge of the at least one display region and adjacent to each other constitute an edge pixel column group, the corner sub-pixels are arranged at an intersection position of the edge pixel row group and the edge pixel column group, and the corner sub-pixels include the first sub-pixel and the third sub-pixel; in the edge pixel row group, at least one kind of the first sub-pixels and the third sub-pixels other than the corner sub-pixels includes the first angle portion and the second angle portion, and the second angle portion is closer to the second pixel row than the first angle portion is; and/or in the edge pixel column group, at least one kind of the first sub-pixels and the third sub-pixels other than the corner sub-pixels includes the first angle portion and the second angle portion, and the second angle portion is closer to the second pixel column than the first angle portion is.

For example, according to embodiments of the present disclosure, in the edge pixel row group, both of the first sub-pixels and the third sub-pixels other than the corner sub-pixels include the first angle portion and the second angle portion, and in the edge pixel column group, both of the first sub-pixels and the third sub-pixels other than the corner sub-pixels include the first angle portion and the second angle portion.

For example, according to embodiments of the present disclosure, in the corner sub-pixel, a distance between an intersection of extension lines or tangents of two sides constituting the third angle portion and a center of the sub-pixel is greater than a distance between an intersection of two sides constituting the fourth angle portion or extension lines or tangents of two sides constituting the fourth angle portion and the center of the sub-pixel, and the fourth angle portion is closer to the second pixel row or the second pixel column adjacent to the corner sub-pixel than the third angle portion is.

For example, according to embodiments of the present disclosure, the first angle portion includes a rounded angle or a flat angle.

For example, according to embodiments of the present disclosure, all of the second angle portion, the third angle portion and the fourth angle portion include rounded angles, and a radius of curvature of the rounded angle of the first angle portion is greater than a radius of curvature of the rounded angle of the second angle portion.

For example, according to embodiments of the present disclosure, the first type sub-pixel, the second type sub-pixel, the third type sub-pixel and the fourth type sub-pixel have a same shape.

For example, according to embodiments of the present disclosure, in at least one first pixel group, one of the third type sub-pixel and the fourth type sub-pixel is arranged between the first type sub-pixel and the second type sub-pixel; and in at least one second pixel group, one of the third type sub-pixel and the fourth type sub-pixel is arranged between the first type sub-pixel and the second type sub-pixel.

For example, according to embodiments of the present disclosure, a number ratio of the first type sub-pixels to the second type sub-pixels is in a range of 0.8-1.2, and a number ratio of the third type sub-pixels to the fourth type sub-pixels is in a range of 0.8-1.2.

At least one embodiment of the present application provides a display substrate including a plurality of sub-pixels. The plurality of sub-pixels includes a plurality of first sub-pixels, a plurality of second sub-pixels and a plurality of third sub-pixels; the plurality of first sub-pixels and the plurality of third sub-pixels are alternately arranged along a row direction and a column direction to form a plurality of first pixel rows and a plurality of first pixel columns, the plurality of second sub-pixels are arrayed along the row direction and the column direction to form a plurality of second pixel rows and a plurality of second pixel columns, the plurality of first pixel rows and the plurality of second pixel rows are alternately arranged along the column direction, and the plurality of first pixel columns and the plurality of second pixel columns are alternately arranged along the row direction; taking centers of a certain first sub-pixel and a certain third sub-pixel adjacent to each other in a same first pixel row, and centers of one first sub-pixel and one third sub-pixels, which are in an adjacent first pixel row and are respectively adjacent to the certain first sub-pixel and the certain third sub-pixel adjacent to each other along the column direction, as four vertices of a virtual quadrilateral, one second sub-pixel is arranged in the virtual quadrilateral. The plurality of sub-pixels include a plurality of light emitting regions, the display substrate includes at least one display region, and in at least one of the first sub-pixel and the third sub-pixel in the first pixel row and the first pixel column at an outermost edge of the at least one display region, vertex angles of the light emitting region include a first angle portion and a second angle portion which are oppositely arranged, and a distance between an intersection of extension lines or tangents of two sides constituting the first angle portion and a center of the sub-pixel is greater than a distance between an intersection of two sides constituting the second angle portion or extension lines or tangents of the two sides constituting the second angle portion and the center of the sub-pixel.

For example, according to embodiments of the present disclosure, one first pixel row and one second pixel row located at an outermost edge of the at least one display region and adjacent to each other constitute an edge pixel row group, and one first pixel column and one second pixel column located at an outermost edge of the at least one display region and adjacent to each other constitute an edge pixel column group, corner sub-pixels are arranged at an intersection position of the edge pixel row group and the edge pixel column group, and the corner sub-pixels include the first sub-pixel and the third sub-pixel; in the edge pixel row group, in sub-pixels other than the corner sub-pixels, the second angle portion is closer to the second pixel row than the first angle portion is; and/or in the edge pixel column group, in sub-pixels other than the corner sub-pixels, the second angle portion is closer to the second pixel column than the first angle portion is.

For example, according to embodiments of the present disclosure, in the edge pixel row group, both of the first sub-pixels and the third sub-pixels other than the corner sub-pixels include the first angle portion and the second angle portion, and in the edge pixel column group, both of the first sub-pixels and the third sub-pixels other than the corner sub-pixels include the first angle portion and the second angle portion.

For example, according to embodiments of the present disclosure, the vertex angles of the light emitting region of the corner sub-pixel further include a third angle portion and a fourth angle portion which are oppositely arranged; in the corner sub-pixel, a distance between an intersection of extension lines or tangents of two sides constituting the third angle portion and a center of the sub-pixel is greater than a distance between an intersection of two sides constituting the fourth angle portion or extension lines or tangents of two sides constituting the fourth angle portion and the center of the sub-pixel, and the fourth angle portion is closer to the second pixel row or the second pixel column adjacent to the corner sub-pixel than the third angle portion is.

For example, according to embodiments of the present disclosure, an area of the third sub-pixel in at least one of the edge pixel row group and the edge pixel column group is less than an area of the third sub-pixel in a non-edge region of the at least one display region; and/or, an area of the first sub-pixel in at least one of the edge pixel row group and the edge pixel column group is less than an area of the first sub-pixel in the non-edge region of the at least one display region.

At least one embodiment of the present application provides a display substrate including a plurality of sub-pixels. The plurality of sub-pixels includes a plurality of first sub-pixels, a plurality of second sub-pixels and a plurality of third sub-pixels; the plurality of first sub-pixels and the plurality of third sub-pixels are alternately arranged along a row direction and a column direction to form a plurality of first pixel rows and a plurality of first pixel columns, the plurality of second sub-pixels are arrayed along the row direction and the column direction to form a plurality of second pixel rows and a plurality of second pixel columns, the plurality of first pixel rows and the plurality of second pixel rows are alternately arranged along the column direction, and the plurality of first pixel columns and the plurality of second pixel columns are alternately arranged along the row direction; taking centers of a certain first sub-pixel and a certain third sub-pixel adjacent to each other in a same first pixel row, and centers of one first sub-pixel and one third sub-pixels, which are in an adjacent first pixel row and are respectively adjacent to the certain first sub-pixel and the certain third sub-pixel adjacent to each other along the column direction, as four vertices of a virtual quadrilateral, one second sub-pixel is arranged in the virtual quadrilateral. The plurality of first pixel rows include a plurality of first axes extending along the row direction, and the plurality of first axes in the plurality of first pixel rows are equally spaced; the plurality of first pixel columns include a plurality of second axes extending along the column direction, and the plurality of second axes in the plurality of first pixel columns are equally spaced; the plurality of sub-pixels include a plurality of light emitting regions; in at least one kind of the first sub-pixels and the third sub-pixels, the light emitting region is divided into a first part and a second part by one of the first axis and the second axis, and is divided into a third part and a fourth part by the other of the first axis and the second axis; an area of the first part is less than an area of the second part, and an area of the third part is the same as an area of the fourth part; at least one kind of the first sub-pixels and the third sub-pixels includes a first type sub-pixel and a second type sub-pixel; in terms of different types of sub-pixels, directions in which a center of the first part points to a center of the second part are different; in the first type sub-pixel and the second type sub-pixel, the directions in which the center of the first part points to the center of the second part are a first direction and a second direction, respectively, and the first direction is opposite to the second direction.

For example, according to embodiments of the present disclosure, the at least one kind of the first sub-pixels and the third sub-pixels further includes a third type sub-pixel and a fourth type sub-pixel; in the third type sub-pixel and the fourth type sub-pixel, directions in which the center of the first part points to the center of the second part are a third direction and a fourth direction, respectively, and the third direction is opposite to the fourth direction.

At least one embodiment of the present application provides a display device, including any display substrate as mentioned above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
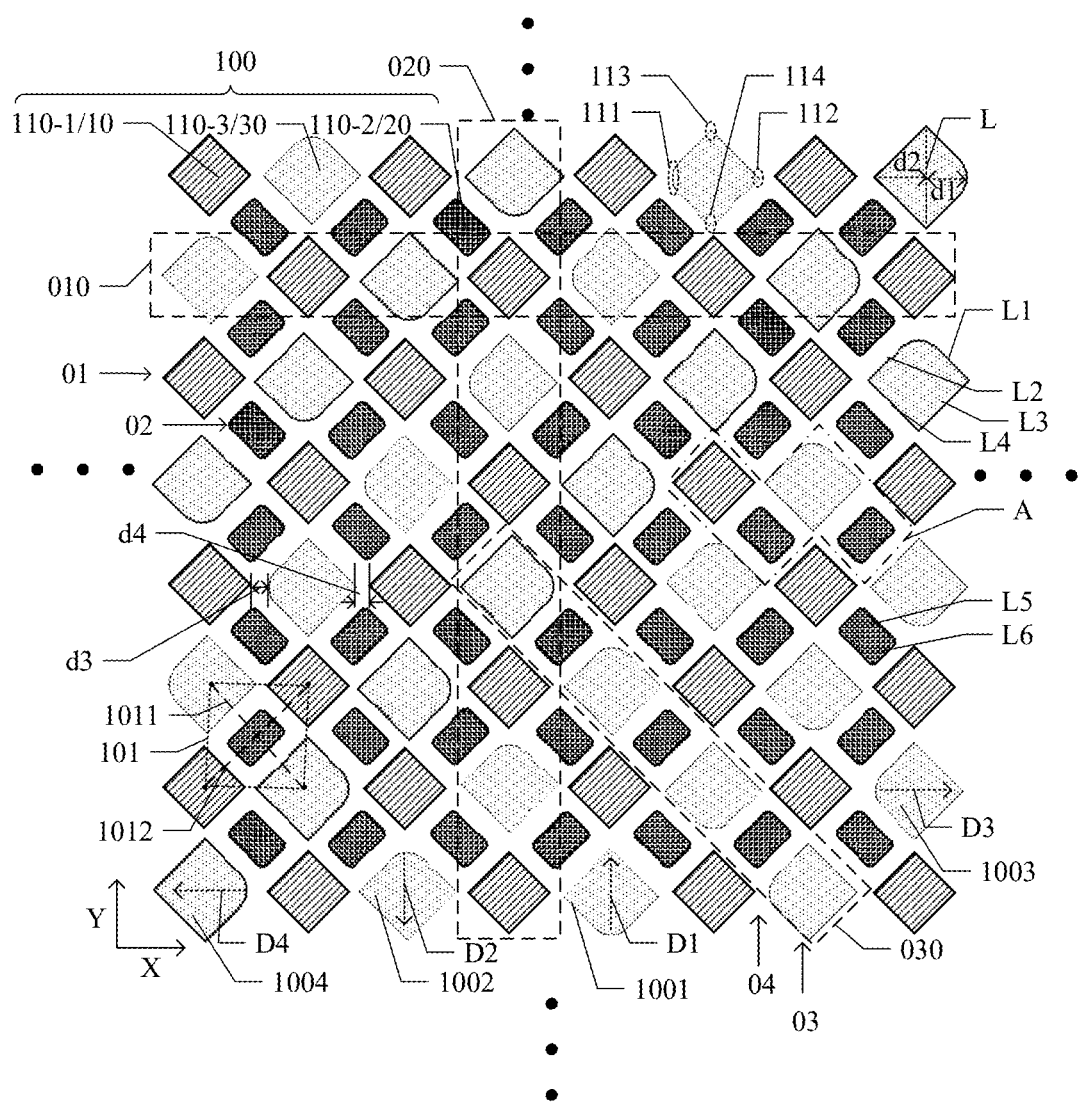
FIG. 1 is a partial structural view of a display substrate provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

The embodiments of the present disclosure provide a display substrate and a display device. The display substrate includes a plurality of sub-pixels. The plurality of sub-pixels include a plurality of first sub-pixels, a plurality of second sub-pixels and a plurality of third sub-pixels; the plurality of first sub-pixels and the plurality of third sub-pixels are alternately arranged along a row direction and a column direction to form a plurality of first pixel rows and a plurality of first pixel columns, the plurality of second sub-pixels are arrayed along the row direction and the column direction to form a plurality of second pixel rows and a plurality of second pixel columns, the plurality of first pixel rows and the plurality of second pixel rows are alternately arranged along the column direction, and the plurality of first pixel columns and the plurality of second pixel columns are alternately arranged along the row direction; taking centers of a certain first sub-pixel and a certain third sub-pixel adjacent to each other in a same first pixel row, and centers of one first sub-pixel and one third sub-pixels, which are in an adjacent first pixel row and are respectively adjacent to the certain first sub-pixel and the certain third sub-pixel adjacent to each other along the column direction, as four vertices of a virtual quadrilateral, one second sub-pixel is arranged in the virtual quadrilateral. The plurality of sub-pixels include a plurality of light emitting regions; in at least one kind of the first sub-pixels, the second sub-pixels and the third sub-pixels, vertex angles of the light emitting region include a first angle portion and a second angle portion which are oppositely arranged, and a distance between an intersection of extension lines or tangents of two sides constituting the first angle portion and a center of the sub-pixel is greater than a distance between an intersection of two sides constituting the second angle portion or their extension lines or tangents and the center of the sub-pixel; the at least one kind of the first sub-pixels, the second sub-pixels and the third sub-pixels include a first type sub-pixel and a second type sub-pixel; in terms of different types of sub-pixels, directions in which a vertex of the first angle portion points to a vertex of the second angle portion are different; in the first type sub-pixel and the second type sub-pixel, the directions in which the vertex of the first angle portion points to the vertex of the second angle portion are a first direction and a second direction, respectively, and the first direction is opposite to the second direction. In the embodiments of the present disclosure, by setting at least one kind of the first sub-pixels, the second sub-pixels and the third sub-pixels included in the display substrate to include two different types of sub-pixels, it is helpful to alleviate the problem of color shift when the display substrate is displaying.

Hereinafter, the display substrate and the display device provided by the embodiments of the present disclosure will be described with reference to the accompanying drawings.

FIG. 1 is a partial structural view of a display substrate provided by an embodiment of the present disclosure. As shown in FIG. 1, the display substrate includes a plurality of sub-pixels 100. As shown in FIG. 1, the plurality of sub-pixels 100 include a plurality of first sub-pixels 10, a plurality of second sub-pixels 20 and a plurality of third sub-pixels 30. The plurality of first sub-pixels 10 and the plurality of third sub-pixels 30 are alternately arranged along a row direction (X direction as shown in FIG. 1) to form a plurality of first pixel rows 01, the plurality of second sub-pixels 20 are arranged along the row direction to form a plurality of second pixel rows 02, the first pixel rows 01 and the second pixel rows 02 are alternately arranged along a column direction (Y direction as shown in FIG. 1), and the plurality of first sub-pixels 10 and the plurality of third sub-pixels 30 are alternately arranged along the column direction.

For example, as shown in FIG. 1, the plurality of first sub-pixels 10 and the plurality of third sub-pixels 30 are alternately arranged along the row direction and the column direction to form a plurality of first pixel rows 01 and a plurality of first pixel columns 03, the plurality of second sub-pixels 20 are arrayed along the row direction and the column direction to form a plurality of second pixel rows 02 and a plurality of second pixel columns 04, and the row direction is intersected with the column direction. For example, the row direction can be perpendicular to the column direction. The row direction and the column direction can be interchanged.

As shown in FIG. 1, taking the centers of a certain first sub-pixel 10 and a certain third sub-pixel 30 adjacent to each other in the first pixel row 01, and the centers of one first sub-pixel 10 and one third sub-pixel 30, which are respectively adjacent to the certain first sub-pixel 10 and the certain third sub-pixel 30 adjacent to each other along the column direction, as four vertices of a virtual quadrilateral 101, one second sub-pixel 20 is arranged in the virtual quadrilateral 101. For example, the second sub-pixel 20 is shifted with the first sub-pixel 10 and the third sub-pixel 30 in an adjacent first pixel row 01.

For example, the center of the sub-pixel is, for example, the geometric center of the sub-pixel, or the intersection of the perpendicular bisectors of sides of the sub-pixel, or the point in the sub-pixel with an approximately equal vertical distance to each side. Of course, the center of the sub-pixel can be allowed to have a certain error. For example, the center of the sub-pixel can be any point within a radius of 3 µm around the geometric center of the sub-pixel.

As shown in FIG. 1, the display substrate includes a plurality of repeating units A arranged in an array; each repeating unit A includes sub-pixels of two rows and four columns, that is, each repeating unit A includes one first sub-pixel 10, one third sub-pixel 30 and two second sub-pixels 20; the first sub-pixel 10 and the third sub-pixel 30 are shared sub-pixels, and these four sub-pixels can realize the display of two virtual pixel units by virtual algorithm. For example, in the same row of repeating units, the first sub-pixel 10 in the second repeating unit, the third sub-pixel 30 in the first repeating unit, and the second sub-pixel 20 which is in the first repeating unit and close to the second repeating unit form a virtual pixel unit, while the first sub-pixel 10 in the second repeating unit also forms a virtual pixel unit with the third sub-pixel 30 in the second repeating unit, as well as the second sub-pixel 20 in the second repeating unit and close to the first repeating unit; and in addition, the third sub-pixel 30 in the second repeating unit forms a virtual pixel unit with the other second sub-pixel 20 in the second repeating unit and the first sub-pixel 10 in the third repeating unit, so that the resolution of the display substrate can be effectively improved.

As shown in FIG. 1, in the case where adjacent angle portions are connected by a straight side, each sub-pixel 100 includes a light emitting region 110. In at least one of the first sub-pixel 10, the second sub-pixel 20 and the third sub-pixel 30, vertex angles of the light emitting region includes a first angle portion 111 and a second angle portion 112 which are oppositely arranged, and a distance between the intersection of the extension lines of two straight sides forming the first angle portion 111 and a center of the sub-pixel is different from a distance between the intersection of the two straight sides forming the second angle portion 112 or the extension lines thereof and the center of the sub-pixel.

Figure 2:
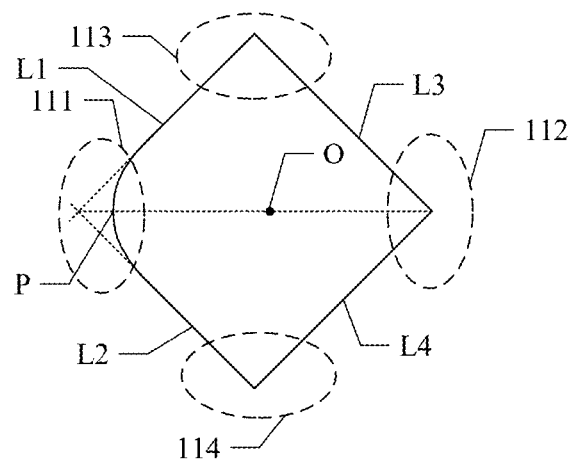
FIG. 2 and FIG. 3 are schematic enlarged views of a third type sub-pixel in different examples.

For example, FIG. 2 is a schematic enlarged view of one sub-pixel shown in FIG. 1. As shown in FIG. 2, the distance between the intersection of the extension lines of two straight sides L1 and L2 constituting the first angle portion 111 and the center O of the sub-pixel is different from the distance between the intersection of two straight sides L3 and L4 constituting the second angle portion 112 and the center O of the sub-pixel.

The sub-pixel in the embodiments of the present disclosure refers to a light emitting device structure, and the first sub-pixel, the second sub-pixel and the third sub-pixel are sub-pixels emitting light of different colors. The embodiments of the present disclosure are illustrated by taking that the first sub-pixel is a red sub-pixel, the second sub-pixel is a green sub-pixel and the third sub-pixel is a blue sub-pixel as an example. However, the case in which the first sub-pixel is a red sub-pixel, the second sub-pixel is a green sub-pixel and the third sub-pixel is a blue sub-pixel, does not limit the protection scope of the embodiments of the present disclosure.

For example, the first sub-pixel 10 and the third sub-pixel 30 are shared sub-pixels, and the areas of both sub-pixels are greater than the area of the second sub-pixel 20 according to their luminescent spectrum. In the display substrate provided by the embodiments of the present disclosure, by adjusting the shapes of some sub-pixels, the distance between the intersection of the extension lines of two straight sides forming the first angle portion and the center of the sub-pixel is different from the distance between the intersection of the two straight sides forming the second angle portion or the extension lines thereof and the center of the sub-pixel in at least one of the first sub-pixel, the second sub-pixel and the third sub-pixel, so as to adjust the actual brightness center of each virtual pixel unit and make the distribution of the actual brightness centers in the display substrate more uniform.

As shown in FIG. 1, at least one kind of the first sub-pixels 10, the second sub-pixels 20 and the third sub-pixels 30 includes a first type sub-pixel 1001, a second type sub-pixel 1002, a third type sub-pixel 1003 and a fourth type sub-pixel 1004. In terms of different types of sub-pixels, the directions in which the vertex of the first angle portion 111 points to the vertex of the second angle portion 112 are different. For example, the positions of the first angle portions 111 in different types of sub-pixels are different. For example, the orientations of the first angle portions 111 in different types of sub-pixels are different.

For example, all types of sub-pixels have the same shape or the same area. For example, all types of sub-pixels have the same shape and the same area. For example, the counts of different types of sub-pixels are approximately the same. For example, in terms of the first type sub-pixels, the second type sub-pixels, the third type sub-pixels and the fourth type sub-pixels, the number ratio of any two types of sub-pixels is in the range of 0.8-1.2. For example, the number ratio of the first type sub-pixels to the second type sub-pixels is in the range of 0.8-1.2, and the number ratio of the third type sub-pixels to the fourth type sub-pixels is in the range of 0.8-1.2.

As shown in FIG. 1, in terms of the first type sub-pixel 1001, the second type sub-pixel 1002, the third type sub-pixel 1003 and the fourth type sub-pixel 1004, the directions in which the vertex of the first angle portion 111 points to the vertex of the second angle portion 112 are the first direction D1, the second direction D2, the third direction D3 and the fourth direction D4, respectively. For example, in the light emitting region of the first type sub-pixel 1001, the direction in which the vertex of the first angle portion 111 points to the vertex of the second angle portion 112 is the first direction D1; in the light emitting region of the second type sub-pixel 1002, the direction in which the vertex of the first angle portion 111 points to the vertex of the second angle portion 112 is the second direction D2; in the light emitting region of the third type sub-pixel 1003, the direction in which the vertex of the first angle portion 111 points to the vertex of the second angle portion 112 is the third direction D3; and in the light emitting region of the fourth type sub-pixel 1004, the direction in which the vertex of the first angle portion 111 points to the vertex of the second angle portion 112 is the fourth direction D4.

As shown in FIG. 1, the first direction D1 is opposite to the second direction D2, and the third direction D3 is opposite to the fourth direction D4.

In the display substrate provided by the embodiments of the present disclosure, by setting four different types of sub-pixels, it is helpful to alleviate the problem of color shift when the display substrate is displaying.

In addition, in a common display substrate, the shapes of the four vertex angles included in the opening regions of the sub-pixels with different colors are all the same. Compared with this display substrate, the display substrate provided by the embodiments of the present disclosure, by arranging the four different types of sub-pixels, is favorable for reducing the graininess when the display substrate is displaying.

For example, as shown in FIG. 1, at least one of the first sub-pixel 10, the second sub-pixel 20 and the third sub-pixel 30 further includes a third angle portion 113 and a fourth angle portion 114 which are oppositely arranged. A connecting line L between the vertex of the third angle portion 113 and the vertex of the fourth angle portion 114 divides the light emitting region into two parts, which have different shapes, and the area of the part in which the first angle portion 111 is located is less than the area of the part in which the second angle portion 112 is located. The connecting line L between the vertex of the third angle portion 113 and the vertex of the fourth angle portion 114 divides the light emitting region into a first part and a second part, the first angle portion is a vertex angle in the first part and the second angle portion is a vertex angle in the second part, then the part in which the first angle portion is located refers to the first part and the part in which the second angle portion is located refers to the second part.

For example, the ratio of the area of the part in which the first angle portion 111 is located to the area of the part in which the second angle portion 112 is located can be in the range of 0.1-0.95. For example, the ratio of the area of the part in which the first angle portion 111 is located to the area of the part in which the second angle portion 112 is located can be in the range of 0.3-0.8. For example, the ratio of the area of the part in which the first angle portion 111 is located to the area of the part in which the second angle portion 112 is located can be in the range of 0.4-0.7.

In a common display substrate, the shapes and areas of the two parts in which the two vertex angles of each sub-pixel opposite to each other are located are the same. Compared with this display substrate, the display substrate provided by the present disclosure, by reducing the area of the part in which the first angle portion is located, can effectively improve the light transmittance of the display substrate in the case where the display substrate is applied to a display device with an under screen fingerprint function or an under screen camera function.

Figure 3:
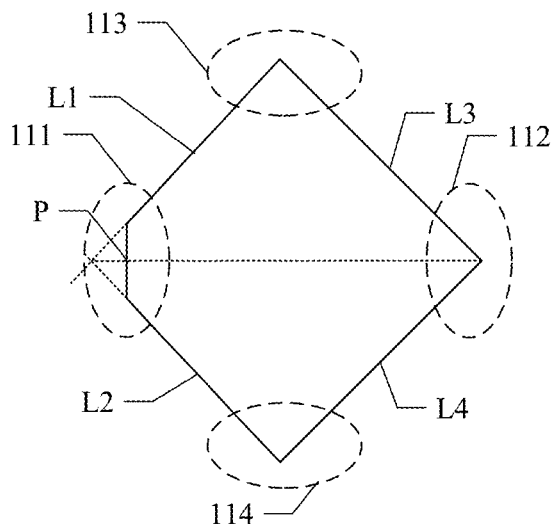

For example, FIG. 2 and FIG. 3 are schematic enlarged views of third type sub-pixels in different examples. As shown in FIG. 2 and FIG. 3, the vertex angle can be an included angle between two lines, such as the second angle portion 112, the third angle portion 113 and the fourth angle portion 114, and for example, all of the three vertex angles can be right angles or acute angles. For example, the intersection of two lines is the vertex of the vertex angle. In this case, the angle portion can include the range of x microns along the contour from the vertex, and the value of x can be in the range of 2~7. As shown in FIG. 2, the vertex angle can also be a curve formed by the parts where two sides of a certain vertex angle extend to its vertex and meet, so that the vertex angle becomes a rounded angle. For example, the first angle portion 111 includes a rounded angle, and the vertex of the vertex angle can be the intersection P of, the connecting line between an intersection of the extension lines of two sides forming the rounded angle and the vertex of the vertex angle opposite to the rounded angle, and the rounded angle. In this case, the angle portion can include the range of x microns along the contour from the vertex P, and the value of x can be in the range of 2-7. In the case where the first angle portion is a round angle and the second angle portion is a right angle or an acute angle, the distance between the intersection of the extension lines of the two straight sides forming the first angle portion and the center of the sub-pixel is greater than the distance between the intersection of the extension lines of the two straight sides forming the second angle portion and the center of the sub-pixel.

The above-mentioned "rounded angle" refers to a vertex angle formed by a section of curve, which can be an arc or an irregular curve, such as a curve cut from an ellipse, a wavy line, etc. The embodiments of the present disclosure illustratively show that the curve has a convex shape with respect to the center of the sub-pixel, but it is not limited to this case, and it can also have a concave shape with respect to the center of the sub-pixel. For example, in the case where the curve is an arc, the central angle of the arc can be in the range of 10 degrees to 150 degrees. For example, the central angle of the arc can be in the range of 60 degrees to 120 degrees. For example, the value of the central angle of the arc can be 90 degrees. For example, the curve length of the rounded angle included in the first angle portion 111 can be in the range of 10-60 microns.

As shown in FIG. 3, the vertex angle can also be a line segment formed by the parts where two sides of a certain vertex angle extend to its vertex and meet, so that the vertex angle becomes a flat angle. For example, the first angle portion 111 includes a flat angle, and the vertex of the vertex angle can be the intersection P of, the connecting line between an intersection of the extension lines of two sides forming the flat angle and the vertex of the vertex angle opposite to the flat angle, and the flat angle.

Figure 4A:
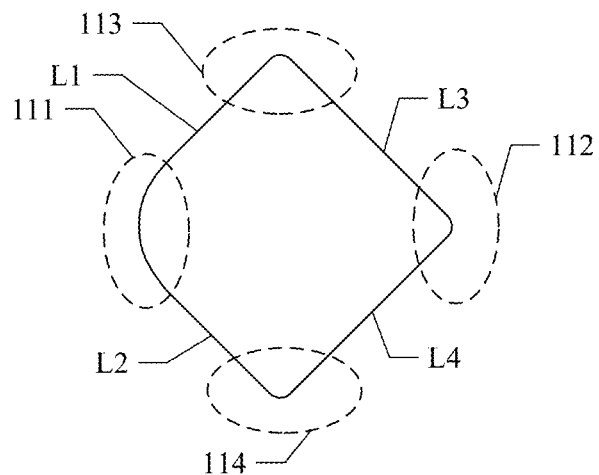
FIG. 4A and FIG. 4B are schematic enlarged views of a third type sub-pixel in different examples.
Figure 4B:
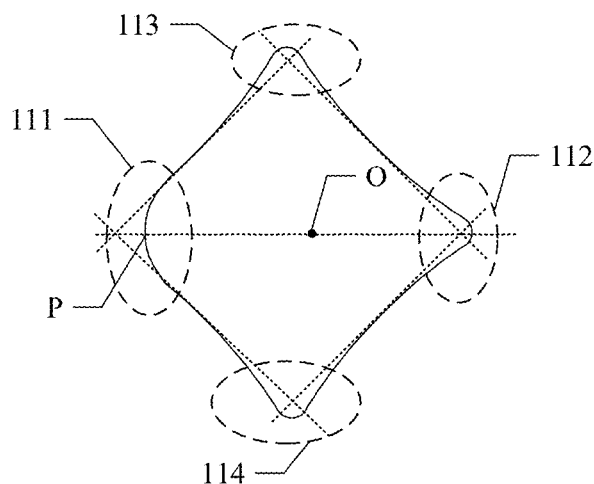

For example, FIG. 4A and FIG. 4B are schematic enlarged views of third type sub-pixels in different examples. As shown in FIG. 4A, the first angle portion 111, the second angle portion 112, the third angle portion 113 and the fourth angle portion 114 all include round angles, and the radius of curvature of the rounded angle of the first angle portion 111 is greater than the radius of curvature of the rounded angle of the second angle portion 112. For example, in the case where the four angle portions all include round angles, the vertex of each angle portion can be the intersection of, the connecting line between an intersection of the extension lines of two sides forming the round angles and an intersection line of the extension lines of two sides forming a rounded angle opposite to the rounded angle, and the rounded angle. In this case, each angle portion can include the range of x microns along the contour from the vertex of the angle portion, and the value of x can be in the range of 2-7.

For example, the radius of curvature of the first angle portion 111 can be 10%-70% of the length of the straight side for forming the rounded angle. For example, the radius of curvature of the first angle portion 111 can be 20%-50% of the length of the straight side for forming the rounded angle.

For example, the length of the connecting line between the vertices of the second angle portion 112 and the third angle portion 113 can be 40 microns. For example, the radius of curvature of the first angle portion 111 can be in the range of 5-20 microns. For example, the radius of curvature of the second angle portion 112 is less than 5 microns.

For example, the radius of curvature of the rounded angle of the first angle portion 111 is greater than the radius of curvature of the rounded angle of any one of the other three angle portions.

For example, as shown in FIG. 4B, it is different from the third type sub-pixel shown in FIG. 4A in that the side connecting adjacent angle portions is a curved side instead of a straight side. In the present example, the definitions of angle portions and vertices in the angle portions are the same as those in the example shown in FIG. 4A. In the example shown in FIG. 4B, each sub-pixel 100 includes a light emitting region 110 in the case where adjacent angle portions are connected by a curved side. In at least one of the first sub-pixel 10, the second sub-pixel 20 and the third sub-pixel 30, the vertex angles of the light emitting region includes a first angle portion 111 and a second angle portion 112 which are oppositely arranged, and the distance between the intersection of tangents of two sides forming the first angle portion 111 and the center of the sub-pixel is different from the distance between the intersection of tangents of two sides forming the second angle portion 112 and the center of the sub-pixel.

Figure 5:
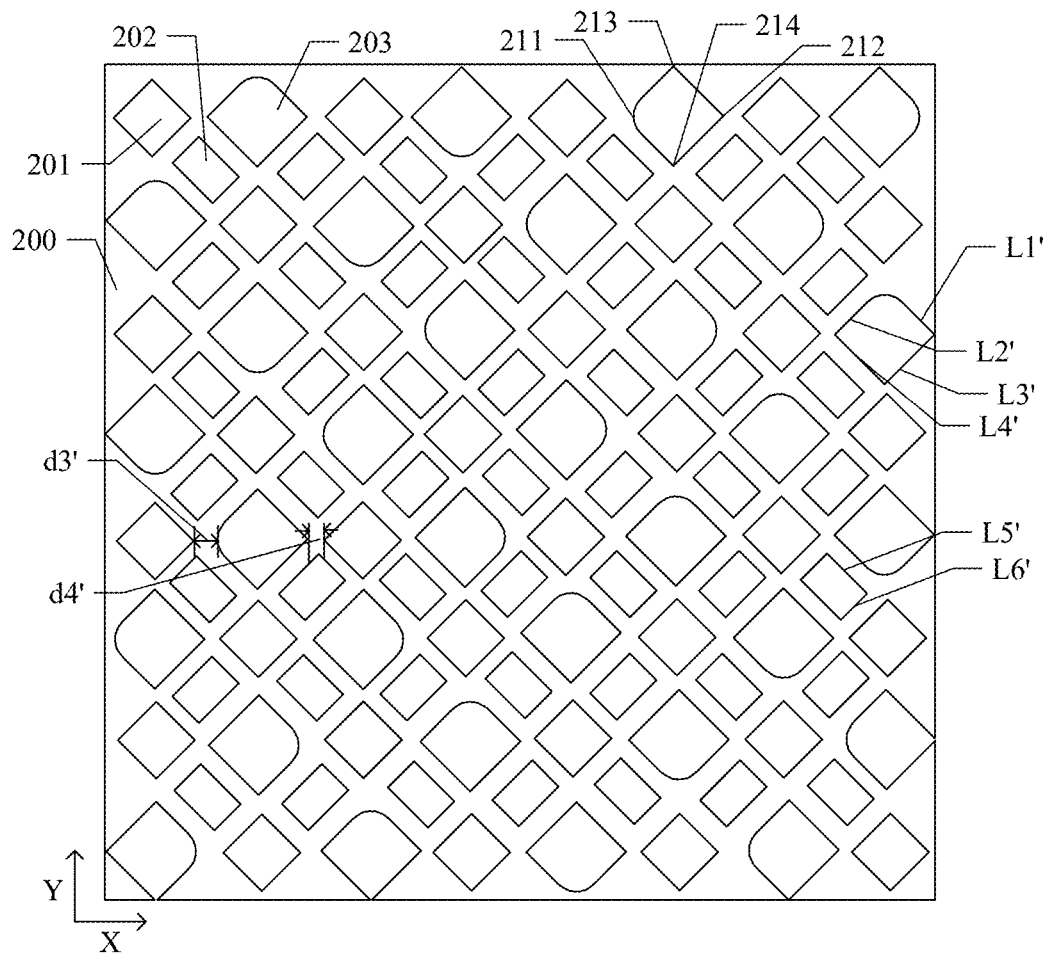
FIG. 5 is a planar structural view of a pixel definition layer defining a display substrate.

For example, FIG. 5 is a planar structural view of a pixel definition layer defining a display substrate. As shown in FIG. 1 and FIG. 5, the shape of the light emitting region of each sub-pixel 100 is defined by the opening in the pixel defining layer 200, and the shape of the light emitting region of each sub-pixel 100 is approximately the same as the shape of the opening in the pixel defining layer 200.

For example, as shown in FIG. 1 and FIG. 5, the pixel defining layer 200 includes a plurality of first openings 201, a plurality of second openings 202 and a plurality of third openings 203. The first opening 201 defines the first light emitting region 110-1 of the first sub-pixel 10, the second opening 202 defines the second light emitting region 110-2 of the second sub-pixel 20, and the third opening 203 defines the third light emitting region 110-3 of the third sub-pixel 30.

For example, each sub-pixel 100 includes a first electrode, a light emitting layer and a second electrode which are stacked. In the case where the light emitting layer is formed in the opening of the pixel defining layer 200, the first electrode and the second electrode located at both sides of the light emitting layer can drive the light emitting layer in the opening of the pixel defining layer 200 to emit light. For example, a functional layer is further provided between the light emitting layer and the first electrode, and/or between the light emitting layer and the second electrode. For example, the functional layer includes any one or more layers of a hole injection layer, a hole transport layer, an electron transport layer, a hole blocking layer, an electron blocking layer, an electron injection layer, an auxiliary luminescent layer, an interface improvement layer, an anti-reflection layer, etc.

The embodiments of the present disclosure illustratively show that the shape of the opening of the pixel defining layer is a quadrilateral, so the shape of the light emitting region of each sub-pixel is also a quadrilateral, which includes four vertex angles. But not limited to this case, the shape of the light emitting region of each sub-pixel can also be triangular, pentagonal or hexagonal, and the number of vertex angles included in the light emitting region will also change accordingly.

For example, as shown in FIG. 1, the shape of at least one of the third angle portion 113 and the fourth angle portion 114 is approximately the same as the shape of the second angle portion 112. For example, the shapes of the second angle portion 112, the third angle portion 113 and the fourth angle portion 114 are approximately the same. That "the shapes of the second angle portion 112, the third angle portion 113 and the fourth angle portion 114 are approximately the same" means, for example, that they have the same angle, the same outline, the same size and the same curvature of rounded angle, etc.

For example, as shown in FIG. 1, the shapes and sizes of the first type sub-pixel 1001, the second type sub-pixel 1002, the third type sub-pixel 1003 and the fourth type sub-pixel 1004 are basically the same, in which sub-pixels of three types can have the same orientation of the first angle portion as the first angle portion of a fourth type sub-pixel after being rotated by a certain angle. Here, the orientation of the first angle portion can refer to the direction in which the vertex of the first angle portion points to the vertex of the second angle portion.

For example, as shown in FIG. 1, the distance d1 between the vertex of the first angle portion 111 and the connecting line L is less than the distance d2 between the vertex of the second angle portion 112 and the connecting line L. For example, the ratio d1/d2 of the distance d1 between the vertex of the first angle portion 111 and the connecting line L to the distance d2 between the vertex of the second angle portion 112 and the connecting line L can be in the range of 0.1-0.9. For example, d1/d2 can be in the range of 0.2-0.8. For example, d1/d2 can be in the range of 0.4-0.6. For example, the ratio of d1 to d2 can be in the range of 0.7-0.9.

For example, as shown in FIG. 1, the length of the connecting line between the vertex of the first angle portion 111 and the vertex of the second angle portion 112 can be a (that is, the sum of the distance d1 and the distance d2), the length of the connecting line L between the vertex of the third angle portion 113 and the vertex of the fourth angle portion 114 can be b, and the ratio of a to b can be in the range of 0.6-0.9. For example, the ratio of a to b can be in the range of 0.7-0.8.

For example, as shown in FIG. 1 and FIG. 5, the display substrate includes a base substrate, and the orthographic projection of the opening of the pixel defining layer on the base substrate is located within the orthographic projection of a corresponding light emitting layer on the base substrate, that is, the light emitting layer covers the opening of the pixel defining layer. For example, the area of the light emitting layer is greater than the area of the corresponding opening of the pixel defining layer, that is, the light emitting layer includes at least a part covering the physical structure of the pixel defining layer in addition to the part at the inner side of the opening of the pixel defining layer. Generally, the physical structure of the pixel defining layer at each boundary of the opening of the pixel defining layer is covered with the light emitting layer.

For example, the light emitting layers of the first sub-pixel 10 and the third sub-pixel 30 adjacent to each other may or may not overlap with each other on the pixel defining layer 200. For example, the light emitting layers of the first sub-pixel 10 and the second sub-pixel 20 adjacent to each other may or may not overlap with each other on the pixel defining layer 200. For example, the light emitting layers of the second sub-pixel 20 and the third sub-pixel 30 adjacent to each other may or may not overlap with each other on the pixel defining layer 200. For example, in the direction parallel to the XY plane, the shortest distance between the vertex of the first angle portion 111 and the boundary of the light emitting layer is less than the shortest distance between the vertex of the second angle portion 112 and the boundary of the light emitting layer. For example, the shortest distance between the vertex of the first angle portion 111 and the boundary of the light emitting layer is less than the shortest distance between the vertex of any one of the other three angle portions and the boundary of the light emitting layer.

For example, as shown in FIG. 1, one of the first direction D1 and the third direction D3 is parallel to the row direction and the other of the first direction D1 and the third direction D3 is parallel to the column direction. FIG. 1 illustratively shows that the third direction D3 and the fourth direction D4 are parallel to the row direction, and the first direction D1 and the second direction D2 are parallel to the column direction, but it is not limited to this case, and the positional relationship between the first direction and the third direction can be interchanged.

For example, the direction indicated by the arrow in the X direction as shown in FIG. 1 is rightward and the direction indicated by the arrow in the Y direction is upward, then the first angle portion 111 of the first type sub-pixel 1001 is located at the lower side of the sub-pixel, the first angle portion 111 of the second type sub-pixel 1002 is located at the upper side of the sub-pixel, the first angle portion 111 of the third type sub-pixel 1003 is located at the left side of the sub-pixel and the first angle portion 111 of the fourth type sub-pixel 1004 is located at the right side of the sub-pixel.

For example, as shown in FIG. 1, the included angle between the row direction and the column direction is in the range of 80 degrees to 100 degrees. For example, the included angle between the first direction D1 and the third direction D3 is in the range of 80 degrees to 100 degrees. For example, the included angle between the first direction D1 and the third direction D3 is in the range of 85 degrees to 90 degrees. For example, the included angle between the first direction D1 and the third direction D3 is 90 degrees, that is, the first direction D1 is perpendicular to the third direction D3.

In the embodiments of the present disclosure, the direction in which the vertex of the first angle portion points to the vertex of the second angle portion in terms of each type of sub-pixel is set to be parallel to the row direction or the column direction, which can ensure the aperture ratio of each sub-pixel and help to alleviate the problem of color shift when the display substrate is displaying.

For example, as shown in FIG. 1, at least one first pixel row 01 includes a plurality of first pixel groups 010, each first pixel group 010 includes eight sub-pixels, and each first pixel group 010 includes first type sub-pixels 1001, second type sub-pixels 1002, third type sub-pixels 1003 and fourth type sub-pixels 1004. For example, the display substrate includes at least one display region, and each first pixel row 01 located at the non-edge position of the display region includes a plurality of first pixel groups 010. For example, each first pixel row 01 in the display substrate includes a plurality of first pixel groups 010.

For example, as shown in FIG. 1, each first pixel group 010 includes four first sub-pixels 10 and four third sub-pixels 30.

For example, in an example of the display substrate shown in FIG. 1, the plurality of third sub-pixels 30 (i.e., blue sub-pixels) in each first pixel group 010 include a first type sub-pixel 1001, a second type sub-pixel 1002, a third type sub-pixel 1003 and a fourth type sub-pixel 1004, while the four first sub-pixels 10 do not include the four types of sub-pixels, that is, the four first sub-pixels 10 in each first pixel group 010 have the same shape, the same size and the same arrangement state.

For example, in an example of the display substrate shown in FIG. 1, in each first pixel group 010, the first type sub-pixel 1001 and the second type sub-pixel 1002 are adjacently arranged, and/or the third type sub-pixel 1003 and the fourth type sub-pixel 1004 are adjacently arranged.

For example, the arrangement order of different types of sub-pixels in each first pixel group 010 can be the second type sub-pixel 1002, the first type sub-pixel 1001, the third type sub-pixel 1003 and the fourth type sub-pixel 1004; the first type sub-pixel 1001, the third type sub-pixel 1003, the fourth type sub-pixel 1004 and the second type sub-pixel 1002; the third type sub-pixel 1003, the fourth type sub-pixel 1004, the second type sub-pixel 1002 and the first type sub-pixel 1001; or the fourth type sub-pixel 1004, the second type sub-pixel 1002, the first type sub-pixel 1001 and the third type sub-pixel 1003.

For example, as shown in FIG. 1, two first pixel groups 010, which are respectively located in adjacent first pixel rows 01 and adjacent to each other, are shifted.

In the display substrate provided by the embodiments of the present disclosure, by arranging a plurality of first pixel groups including the above four different types of sub-pixels in the row direction at least at the non-edge position of the display region, it is helpful to alleviate the problem of color shift when the display substrate displays details such as a horizontal line (for example, only one of a plurality of first pixel rows is included), etc. Of course, the embodiments of the present disclosure are not limited to the case in which the four different types of sub-pixels are arranged in the row direction, and the row direction and the column direction can be interchanged. Therefore, in the display substrate provided by the embodiments of the present disclosure, the four different types of sub-pixels can be arranged in the column direction at least at the non-edge position of the display region, so as to alleviate the problem of color shift when the display substrate displays details such as a vertical line, etc.

For example, as shown in FIG. 1, at least one first pixel column 03 includes a plurality of second pixel groups 020, each second pixel group 020 includes eight sub-pixels 100, and each second pixel group 020 includes a first type sub-pixel 1001, a second type sub-pixel 1002, a third type sub-pixel 1003 and a fourth type sub-pixel 1004. For example, the display substrate includes at least one display region, and each first pixel column 03 located at the non-edge position of the display region includes a plurality of second pixel groups 020. For example, each first pixel column 03 in the display substrate includes a plurality of second pixel groups 020.

For example, as shown in FIG. 1, each second pixel group 020 includes four first sub-pixels 10 and four third sub-pixels 30.

For example, in an example of the display substrate shown in FIG. 1, the plurality of third sub-pixels 30 (i.e., blue sub-pixels) in each second pixel group 020 include a first type sub-pixel 1001, a second type sub-pixel 1002, a third type sub-pixel 1003 and a fourth type sub-pixel 1004, while the four first sub-pixels 10 do not include the four types of sub-pixels as mentioned above, that is, the four first sub-pixels 10 in each second pixel group 020 have the same shape, the same size and the same arrangement state.

For example, as shown in FIG. 1, in each second pixel group 020, the first type sub-pixel 1001 and the second type sub-pixel 1002 are adjacently arranged, and/or the third type sub-pixel 1003 and the fourth type sub-pixel 1004 are adjacently arranged.

For example, the arrangement order of different types of sub-pixels in each second pixel group 020 can be the first type sub-pixel 1001, the third type sub-pixel 1003, the fourth type sub-pixel 1004 and the second type sub-pixel 1002; the third type sub-pixel 1003, the fourth type sub-pixel 1004, the second type sub-pixel 1002 and the first type sub-pixel 1001; the fourth type sub-pixel 1004, the second type sub-pixel 1002, the first type sub-pixel 1001 and the third type sub-pixel 1003; or the second type sub-pixel 1002, the first type sub-pixel 1001, the third type sub-pixel 1003 and the fourth type sub-pixel 1004.

In the display substrate provided by the embodiments of the present disclosure, the first pixel group and the second pixel group, both of which include the above four different types of sub-pixels, are respectively arranged in the row direction and the column direction at least at the non-edge position of the display region, which is helpful to alleviate the problem of color shift when the display substrate displays details such as a horizontal line and a vertical line (for example, only one of a plurality of first pixel columns is included), etc.

For example, as shown in FIG. 1, first sub-pixels 10 and second sub-pixels 20 are alternately arranged along the extending direction of the first diagonal line 1011 of the virtual quadrilateral 101, and third sub-pixels 30 and second sub-pixels 20 are alternately arranged along the extending direction of the second diagonal line 1012 of the virtual quadrilateral 101. For example, the extending direction of the first diagonal line 1011 is intersected with both the row direction and the column direction, and the extending direction of the second diagonal line 1012 of the virtual quadrilateral 101 is intersected with both the row direction and the column direction.

For example, as shown in FIG. 1, the sub-pixels 100 arranged along the extending direction of one of the first diagonal line 1011 and the second diagonal line 1012 of the virtual quadrilateral 101 include a plurality of third pixel groups 030, each third pixel group 030 includes eight sub-pixels 100, and each third pixel group 030 includes a first type sub-pixel 1001, a second type sub-pixel 1002, a third type sub-pixel 1003 and a fourth type sub-pixel 1004.

For example, in an example of the display substrate shown in FIG. 1, each third pixel group 030 includes four third sub-pixels 30 and four second sub-pixels 20. The four third sub-pixels 30 in each third pixel group 030 can be one first type sub-pixel 1001, one second type sub-pixel 1002, one third type sub-pixel 1003 and one fourth type sub-pixel 1004, respectively, while the four second sub-pixels 20 do not include the four types of sub-pixels, that is, the four second sub-pixels 20 in each third pixel group 030 have the same shape, the same size and the same arrangement state.

For example, as shown in FIG. 1, in each third pixel group 030, the first type sub-pixel 1001 and the second type sub-pixel 1002 are adjacently arranged, and/or the third type sub-pixel 1003 and the fourth type sub-pixel 1004 are adjacently arranged.

For example, the arrangement order of different types of sub-pixels in each third pixel group 030 can be the fourth type sub-pixel 1004, the second type sub-pixel 1002, the first type sub-pixel 1001 and the third type sub-pixel 1003; the second type sub-pixel 1002, the first type sub-pixel 1001, the third type sub-pixel 1003 and the fourth type sub-pixel 1004; the first type sub-pixel 1001, the third type sub-pixel 1003, the fourth type sub-pixel 1004 and the second type sub-pixel 1002; or the third type sub-pixel 1003, the fourth type sub-pixel 1004, the second type sub-pixel 1002 and the first type sub-pixel 1001.

In the display substrate provided by the embodiments of the present disclosure, the first pixel group, the second pixel group and the third pixel group, all of which include the above four different types of sub-pixels, are respectively arranged in the row direction, the column direction and an oblique direction, which is helpful to alleviate the problem of color shift when the display substrate displays details such as a horizontal line, a vertical line and an oblique line, etc.

For example, as shown in FIG. 1, the light emitting region shape of the light emitting region 110-1 of the first sub-pixel 10 includes a plurality of vertex angles, the shapes of the vertex angles are approximately the same, and the vertex angle of the third sub-pixel 30 and the vertex angle of the first sub-pixel 10 are opposite to each other. For example, the shapes of the light emitting regions of the first sub-pixel 10 and the third sub-pixel 30 are quadrilaterals, that is, both of them include four vertex angles; and the four angle portions of each type of sub-pixel included in the third sub-pixels 30 are respectively opposite to four vertex angles of four first sub-pixels 10 surrounding the third sub-pixel 30.

For example, as shown in FIG. 1, the shortest distance d3 between the first angle portion 111 of the third sub-pixel 30 and the vertex angle of the first sub-pixel 10 is greater than the shortest distance d4 between the second angle portion 112 of the third sub-pixel 30 and the vertex angle of the first sub-pixel 10. For example, as shown in FIG. 1, the shortest distances d4 between the other three angle portions of the third sub-pixel 30 (e.g., the second angle portion 112, the third angle portion 113 and the fourth angle portion 114) and the corresponding three vertex angles of the first sub-pixels 10 are approximately the same. For example, the ratio of d4 to d3 can be in the range of 0.3-0.9. For example, the ratio of d4 to d3 can be in the range of 0.4-0.8.

For example, as shown in FIG. 1 and FIG. 5, the third opening 203 for forming the third light emitting region 110-3 of the third sub-pixel 30 in the pixel defining layer 200 has the same shape, size and arrangement state as the third light emitting region 110-3, and the third opening 203 also has a first opening angle portion 211, a second opening angle portion 212, a third opening angle portion 213 and a fourth opening angle portion 214, which are in one-to-one correspondence with the first angle portion 111, the second angle portion 112, the third angle portion 113 and the fourth angle portion 114 of the third light emitting region 110-3. For example, as shown in FIG. 5, the shortest distance d3' between the first opening angle portion 211 of the third opening 203 and the opening vertex angle of the first opening 201 is greater than the shortest distance d4' between the second opening angle portion 212 of the third opening 203 and the opening vertex angle of the first opening 201. For example, as shown in FIG. 5, the shortest distances between the other three opening angle portions of the third opening 203 (e.g., the second opening angle portion 212, the third opening angle portion 213 and the fourth opening angle portion 214) and the opening vertex angle of the first opening 201 are approximately the same.

The embodiments of the present disclosure can adjust the shape of the third sub-pixel in the display substrate and the distances between respective angle portions of the third sub-pixel and respective vertex angles of the first sub-pixel by adjusting the shape of the third opening of the pixel defining layer and the distance between respective opening angle portions of the third opening and respective opening vertex angles of the first opening.

For example, as shown in FIG. 1, in the third sub-pixel 30, the length of the first straight side L1 connecting the first angle portion 111 and the third angle portion 113 is equal to the length of the second straight side L2 connecting the first angle portion 111 and the fourth angle portion 114; the length of the third straight side L3 connecting the second angle portion 112 and the third angle portion 113 is equal to the length of the fourth straight side L4 connecting the second angle portion 112 and the fourth angle portion 114, and the length of the first straight side L1 is less than the length of the third straight side L3.

For example, as shown in FIG. 2, in the case where the first angle portion 111 includes a rounded angle and the other three angle portions are all acute angles or right angles, the first straight side L1 refers to a straight line connecting the end point, close to the third angle portion 113, of the curve forming the rounded angle and the vertex of the third angle portion 113; the second straight side L2 refers to a straight line connecting the end point, close to the fourth angle portion 114, of the curve forming the rounded angle and the vertex of the fourth angle portion 114; the third straight side L3 refers to a straight line connecting the vertex of the second angle portion 112 and the vertex of the third angle portion 113, and the fourth straight side L4 refers to a straight line connecting the vertex of the second angle portion 112 and the vertex of the fourth angle portion 114.

The embodiments of the present disclosure are not limited to the case in which the side connecting adjacent angle portions is a straight side, and for example, it can also be a curved side as shown in FIG. 4B; then the length of the side connecting adjacent angle portions can also refer to the length of the curved side, and the curved side refers to the part at an outer side of the end point of the rounded angle.

For example, as shown in FIG. 3, in the case where the first angle portion 111 includes a flat angle and the other three angle portions are all acute angles or right angles, the first straight side L1 refers to a straight line connecting the end point, close to the third angle portion 113, of the line segment forming the flat angle and the vertex of the third angle portion 113; the second straight side L2 refers to a straight line connecting the end point, close to the fourth angle portion 114, of the line segment forming the flat angle and the vertex of the fourth angle portion 114; the third straight side L3 refers to a straight line connecting the vertex of the second angle portion 112 and the vertex of the third angle portion 113, and the fourth straight side L4 refers to a straight line connecting the vertex of the second angle portion 112 and the vertex of the fourth angle portion 114.

For example, as shown in FIG. 4A, in the case where the first angle portion 111, the second angle portion 112, the third angle portion 113 and the fourth angle portion 114 are all rounded angles, the first straight line L1 refers to a straight line connecting the end point, close to the third angle portion 113, of the curve forming the rounded angle of the first angle portion 111 and the end point, close to the first angle portion 111, of the curve forming the rounded angle of the third angle portion 113; the second straight line L2 refers to a straight line connecting the end point, close to the fourth angle portion 114, of the curve forming the rounded angle of the first angle portion 111 and the end point, close to the first angle portion 111, of the curve forming the rounded angle of the fourth angle portion 114; the third straight line L3 refers to a straight line connecting the end point, close to the third angle portion 113, of the curve forming the rounded angle of the second angle portion 112 and the end point, close to the second angle portion 112, of the curve forming the rounded angle of the third angle portion 113; and the fourth straight side L4 refers to a straight line connecting the end point, close to the fourth angle portion 114, of the curve forming the rounded angle of the second angle portion 112 and the end point, close to the second angle portion 112, of the curve forming the rounded angle of the fourth angle portion 114.

In the display substrate provided by the embodiments of the present disclosure, the position of the brightness center of the third sub-pixel can be adjusted by setting the lengths of the four sides of the light emitting region of the third sub-pixel.

For example, as shown in FIG. 5, the length of the first opening straight side L1' connecting the first opening angle portion 211 and the third opening angle portion 213 of the third opening 203 is equal to the length of the second opening straight side L2' connecting the first opening angle portion 211 and the fourth opening angle portion 214 of the third opening 203. For example, the length of the third opening straight side L3' connecting the second opening angle portion 212 and the third opening angle portion 213 of the third opening 203 is equal to the length of the fourth opening straight side L4' connecting the second opening angle portion 212 and the fourth opening angle portion 214 of the third opening 203, and the length of the first opening straight side L1' is less than the length of the third opening straight side L3'. The definition manner of each opening straight side of the third opening is the same as the definition manner of each straight side of the light emitting region of the third sub-pixel, which will not be repeated here.

For example, as shown in FIG. 1, the light emitting region 110-2 of the second sub-pixel 20 includes fifth straight sides L5 which are oppositely arranged and parallel to each other, and sixth straight sides L6 which are oppositely arranged and parallel to each other. The fifth straight side L5 is parallel to the straight side of the light emitting region 110-3 of the third sub-pixel 20, and the sixth straight side L6 is parallel to the straight side of the light emitting region 110-1 of the first sub-pixel 10.

For example, as shown in FIG. 1, the shape of the light emitting region of each second sub-pixel 20 can be a rectangle or a rounded rectangle. The rectangle includes a standard rectangle and an approximate rectangle, the standard rectangle means that the included angle between two adjacent sides is 90 degrees, and the approximate rectangle means that the included angle between two adjacent sides is close to 90 degrees, such as 88 degrees to 92 degrees.

For example, in the case where the shape of each second sub-pixel 20 is a rectangle, the fifth straight side and the sixth straight side refer to two adjacent sides that are directly intersected. The rounded rectangle refers to the case that at least one of the four angles of a rectangle is rounded, that is, the adjacent sides of the rectangle are connected by a short arc to form a rounded angle. For example, four sides of a rounded rectangle can be extended and then cross each other to form a rectangle. For example, in the case where the shape of each second sub-pixel 20 is a rounded rectangle, the fifth straight side and the sixth straight side as mentioned above refer to two adjacent sides connecting the two ends of the curve forming the rounded angle.

For example, as shown in FIG. 1, the ratio of the length of the first straight side L1 of the third sub-pixel 30 to the length of the fifth straight side L5 of the second sub-pixel 20 is in the range of 0.7-1.5, and the length of the third straight side L3 of the third sub-pixel 30 is greater than the length of the fifth straight side L5 of the second sub-pixel 20.

For example, as shown in FIG. 5, the second opening 202 for forming the second sub-pixel 20 in the pixel defining layer 200 includes fifth opening straight sides L5' which are oppositely arranged and parallel to each other, and the sixth opening straight sides L6' which are oppositely arranged and parallel to each other. The fifth opening straight side L5' is parallel to the opening straight side of the third opening 203, and the sixth opening straight side L6' is parallel to the opening straight side of the first opening 201.

For example, as shown in FIG. 5, the length of the first opening straight side L1' of the third opening 203 is not greater than the length of the fifth opening straight side L5' of the second opening 202, and the length of the third opening straight side L3' of the third opening 203 is greater than the length of the fifth opening straight side L5' of the second opening 202.

For example, as shown in FIG. 1, the third sub-pixels 30 arranged along the extending direction of the other of the first diagonal line 1011 and the second diagonal line 1012 of the virtual quadrilateral 101 can be sub-pixels of the same type, and for example, they can all be the first type of sub-pixels 1001, the second type of sub-pixels 1002, the third type of sub-pixels 1003 or the fourth type of sub-pixels 1004.

For example, as shown in FIG. 1, four third sub-pixels 30 surrounding each first sub-pixel 10 include at least two different types of sub-pixels. For example, as shown in FIG. 5, four third sub-pixels 30 surrounding each first sub-pixel 10 can include two different types of sub-pixels or four different types of sub-pixels.

Figure 6:
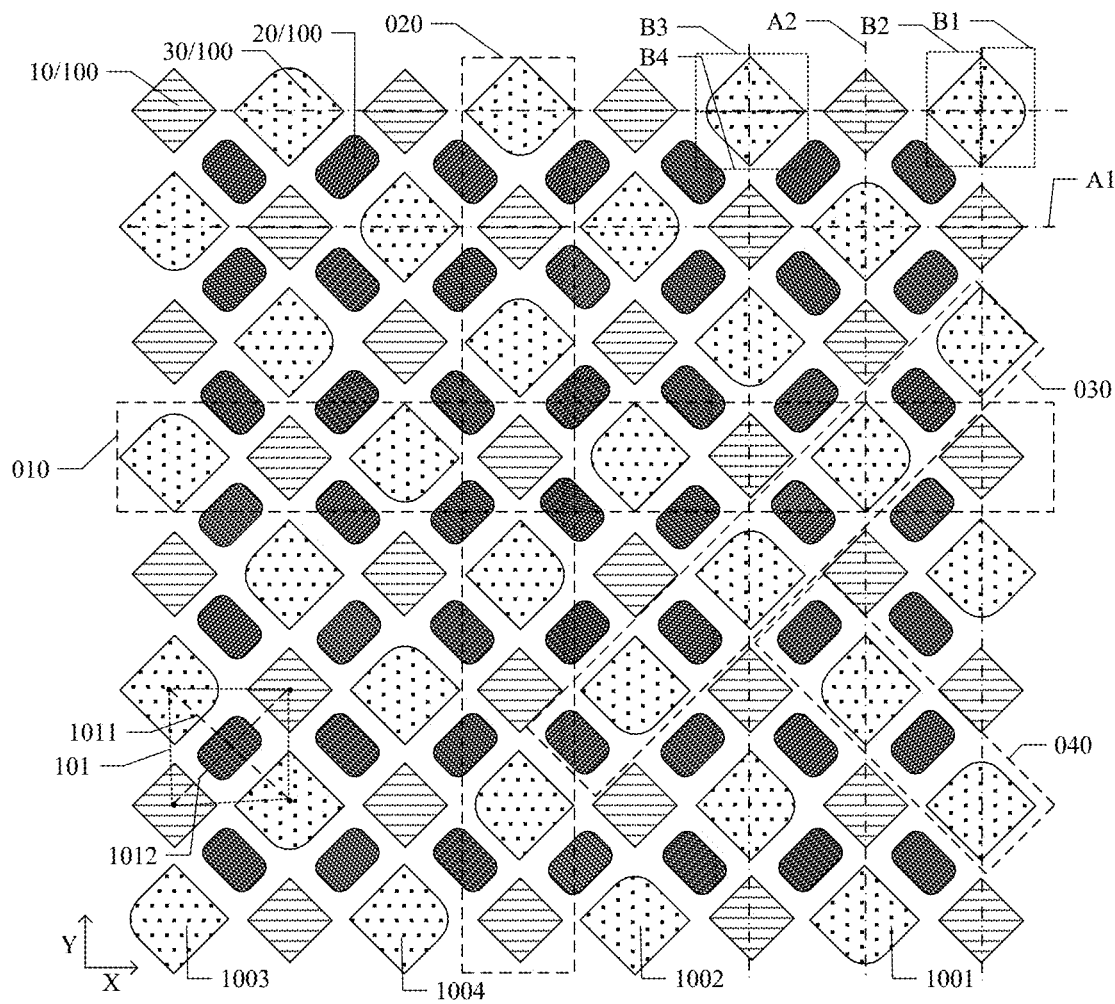
FIG. 6 is a partial planar structural view of a pixel arrangement in a display substrate provided by another example of the embodiment of the present disclosure.

For example, FIG. 6 is a partial planar structural view of pixel arrangement in a display substrate provided by another example of the embodiment of the present disclosure. The example shown in FIG. 6 is different from the example shown in FIG. 5 in that the sub-pixels 100 arranged along the extending direction of one of the first diagonal line 1011 and the second diagonal line 1012 of the virtual quadrilateral 101 include a plurality of third pixel groups 030, each third pixel group 030 includes eight sub-pixels 100, and each third pixel group 030 includes a first type sub-pixel 1001, a second type sub-pixel 1002, a third type sub-pixel 1003 and a fourth type sub-pixel 1004; the sub-pixels 100 arranged along the extending direction of the other of the first diagonal line 1011 and the second diagonal line 1012 of the virtual quadrilateral 101 include a plurality of fourth pixel groups 040, each fourth pixel group 040 includes four sub-pixels 100, and each fourth pixel group 040 includes two types of sub-pixels among the first type sub-pixels 1001, the second type sub-pixels 1002, the third type sub-pixels 1003 and the fourth type sub-pixels 1004.

For example, as shown in FIG. 6, in the present example, the arrangement order of eight sub-pixels 100 included in each third pixel group 030 can be the same as or different from the arrangement order of eight sub-pixels 100 included in each third pixel group 030 shown in FIG. 5, which is not limited in the present example.

According to an example of an embodiment of the present disclosure, each fourth pixel group 040 includes two third sub-pixels 30 and two second sub-pixels 20. The two third sub-pixels 30 in each fourth pixel group 040 can be any two of the first type sub-pixel 1001, the second type sub-pixel 1002, the third type sub-pixel 1003 and the fourth type sub-pixel 1004, while the two second sub-pixels 20 do not include the four types of sub-pixels, that is, the two second sub-pixels 20 in each fourth pixel group 040 have the same shape, the same size and the same arrangement state.

For example, as shown in FIG. 6, each fourth pixel group 040 includes a first type sub-pixel 1001 and a fourth type sub-pixel 1004, or includes a third type sub-pixel 1003 and a second type sub-pixel 1002.

In the display substrate provided by the embodiments of the present disclosure, the first pixel group, the second pixel group and the third pixel group, all of which include the above four different types of sub-pixels, are respectively arranged in the row direction, the column direction and one oblique direction, and the fourth pixel group including the two different types of sub-pixels is arranged in the other oblique direction, which can further alleviate the problem of color shift when the display substrate displays details such as a horizontal line, a vertical line and an oblique line, etc.

For example, as shown in FIG. 6, four third sub-pixels 30 surrounding each first sub-pixel 10 are one first type sub-pixel 1001, one second type sub-pixel 1002, one third type sub-pixel 1003 and one fourth type sub-pixel 1004, respectively.

In the embodiments of the present disclosure, by setting the four third sub-pixels surrounding the first sub-pixel to include four different types of sub-pixels, it is helpful to reduce color shift and homogenize the visual effect in terms of displaying a detailed image which includes a small number of sub-pixels.

Figure 7:
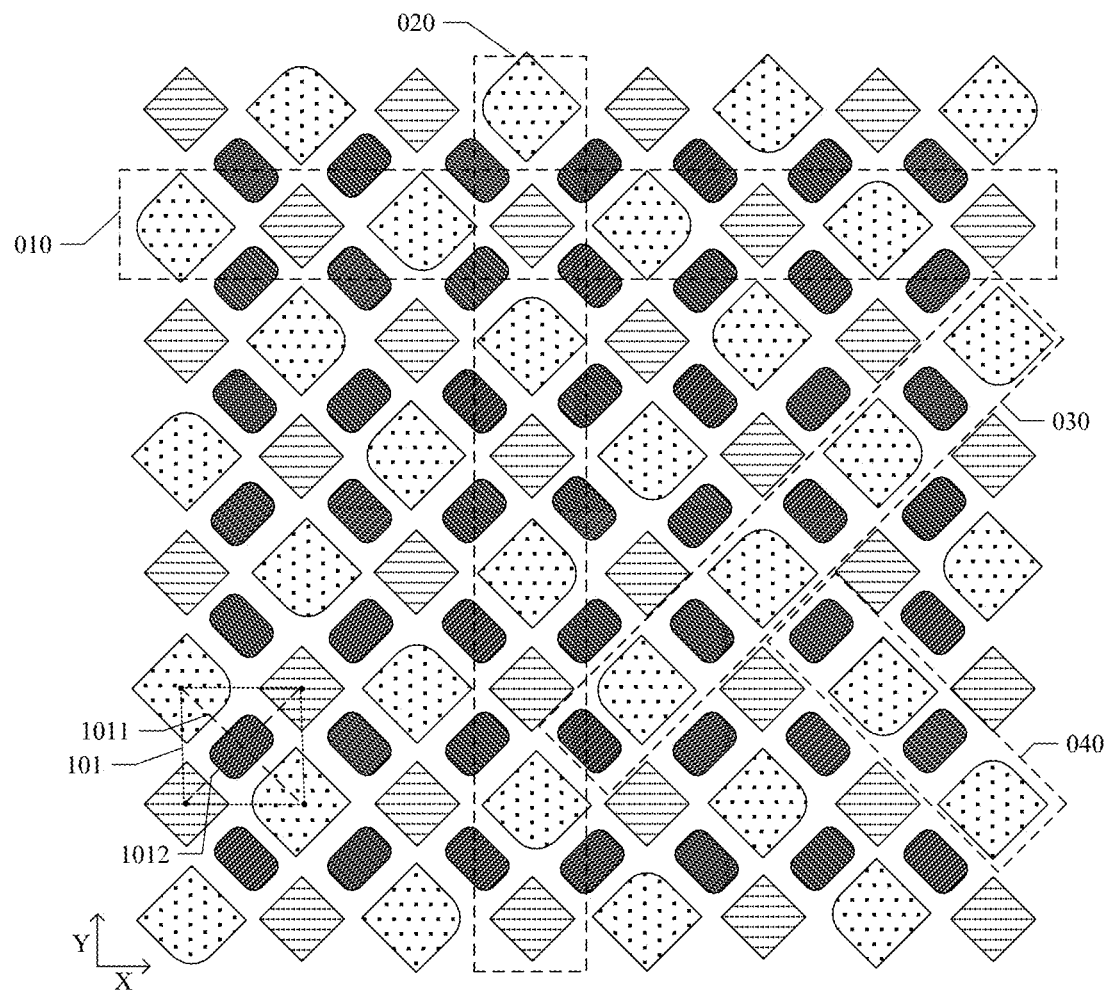
FIG. 7 is a partial planar structural view of a pixel arrangement in a display substrate provided by another example of the embodiment of the present disclosure.

For example, FIG. 7 is a partial planar structural view of pixel arrangement in a display substrate provided by another example of the embodiment of the present disclosure. The example shown in FIG. 7 differs from the example shown in FIG. 6 in the arrangement order of different types of sub-pixels in each pixel group. For example, as shown in FIG. 7, in the first pixel group 010, a third type sub-pixel 1003 or a fourth type sub-pixel 1004 is arranged between the first type sub-pixel 1001 and the second type sub-pixel 1002; in the second pixel group 020, a third type sub-pixel 1003 or a fourth type sub-pixel 1004 is arranged between the first type sub-pixel 1001 and the second type sub-pixel 1002; and in the third pixel group 030, a third type sub-pixel 1003 or a fourth type sub-pixel 1004 is arranged between the first type sub-pixel 1001 and the second type sub-pixel 1002.

For example, as shown in FIG. 7, each fourth pixel group 040 includes a first type sub-pixel 1001 and a second type sub-pixels 1004, or includes a third type sub-pixel 1003 and a fourth type sub-pixel 1004.

In the display substrate provided by the embodiments of the present disclosure, the first pixel group, the second pixel group and the third pixel group, all of which include the above four different types of sub-pixels, are respectively arranged in the row direction, the column direction and one oblique direction, and the fourth pixel group including the two different types of sub-pixels is arranged in the other oblique direction, which can further alleviate the problem of color shift when the display substrate displays details such as a horizontal line, a vertical line and an oblique line, etc.

Figure 8:
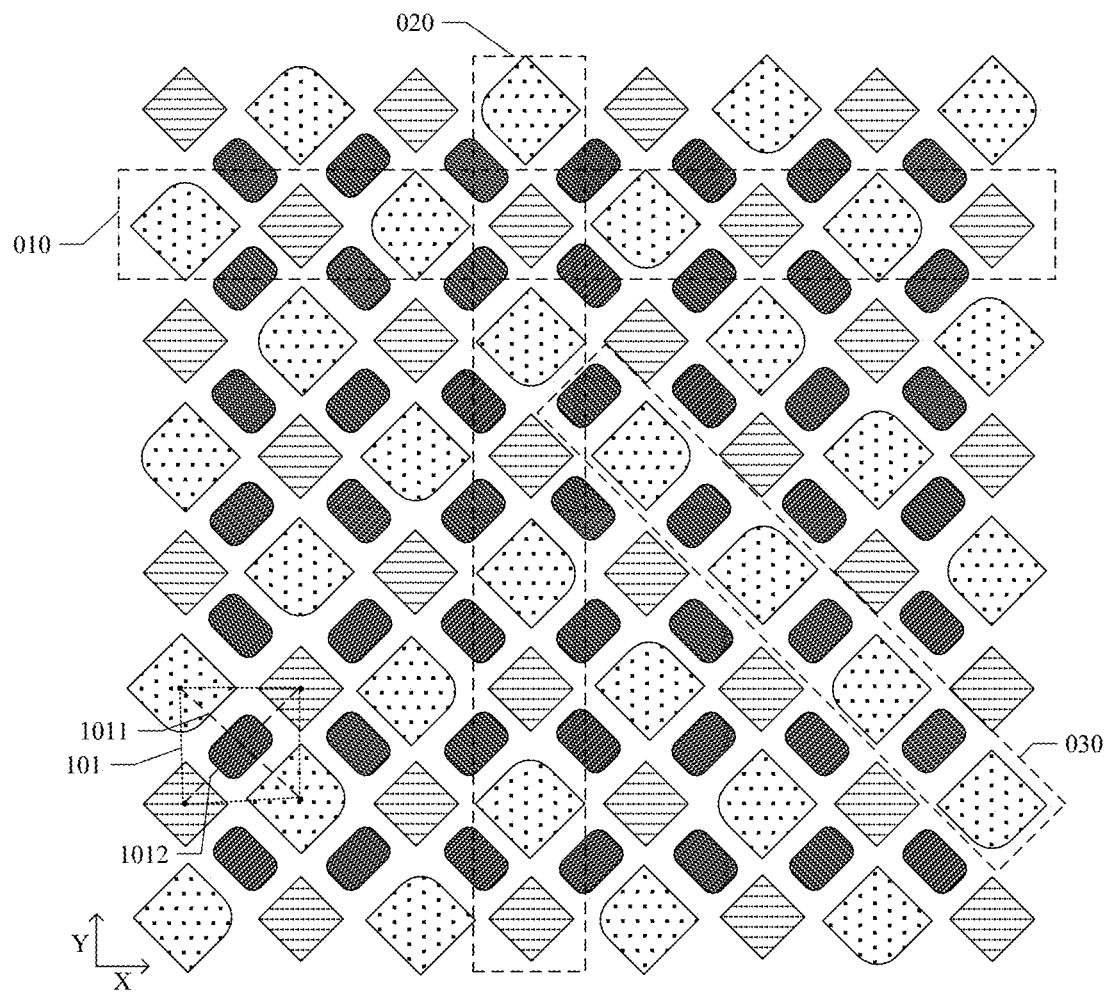
FIG. 8 is a partial planar structural view of a pixel arrangement in a display substrate provided by another example of the embodiment of the present disclosure.

For example, FIG. 8 is a partial planar structural view of pixel arrangement in a display substrate provided by another example of the embodiment of the present disclosure. The example shown in FIG. 8 differs from the example shown in FIG. 1 in the arrangement order of different types of sub-pixels in each pixel group. For example, as shown in FIG. 8, in the first pixel group 010, a third type sub-pixel 1003 or a fourth type sub-pixel 1004 is arranged between the first type sub-pixel 1001 and the second type sub-pixel 1002; in the second pixel group 020, a third type sub-pixel 1003 or a fourth type sub-pixel 1004 is arranged between the first type sub-pixel 1001 and the second type sub-pixel 1002; and in the third pixel group 030, a third type sub-pixel 1003 or a fourth type sub-pixel 1004 is arranged between the first type sub-pixel 1001 and the second type sub-pixel 1002.

In the display substrate provided by the embodiments of the present disclosure, the first pixel group, the second pixel group and the third pixel group, all of which include the above four different types of sub-pixels, are respectively arranged in the row direction, the column direction and an oblique direction, which is helpful to alleviate the problem of color shift when the display substrate displays details such as a horizontal line, a vertical line and an oblique line, etc.

Figure 9:
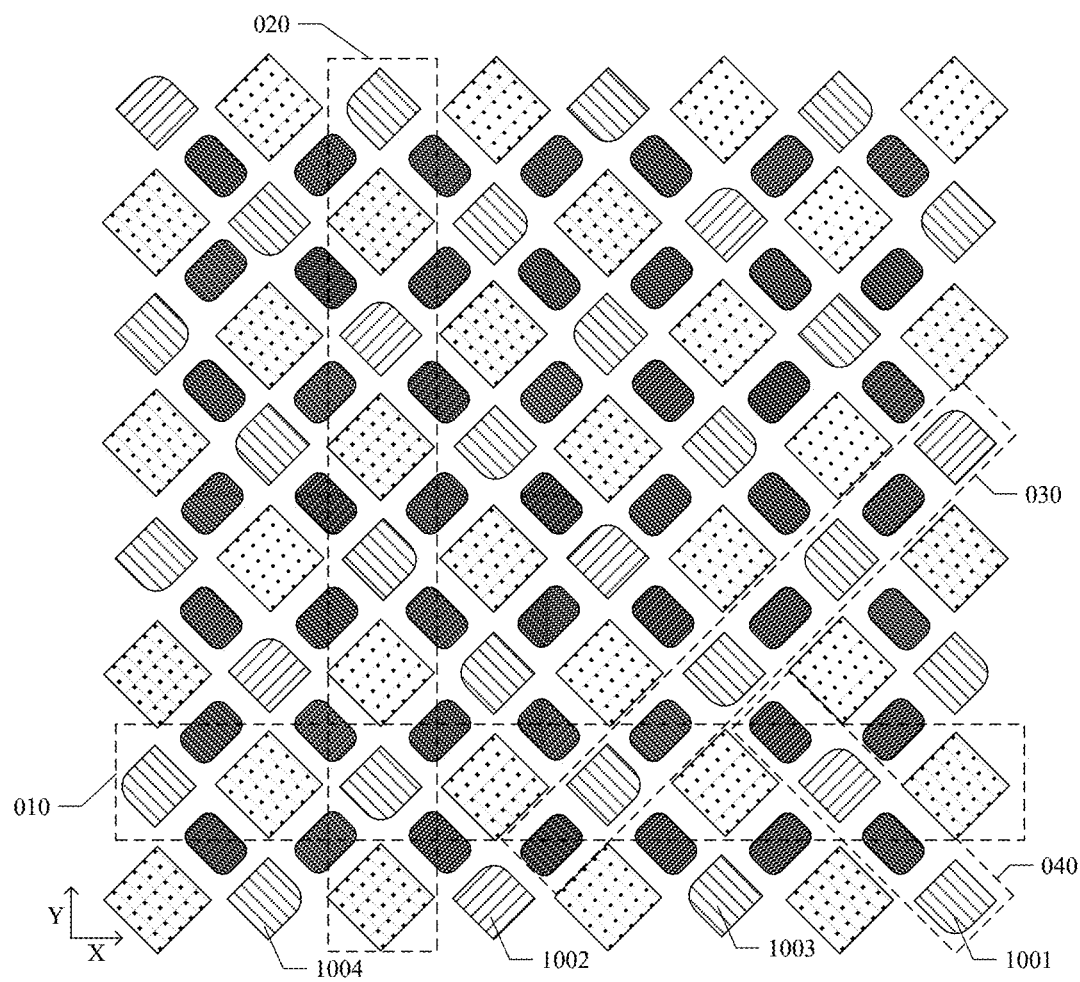
FIG. 9 is a partial planar structural view of a pixel arrangement in a display substrate provided by another example of the embodiment of the present disclosure.

For example, FIG. 9 is a partial planar structural view of pixel arrangement in a display substrate provided by another example of the embodiment of the present disclosure. The example shown in FIG. 9 differs from the example shown in FIG. 7 in that the first sub-pixels 10 includes a first type sub-pixel 1001, a second type sub-pixel 1002, a third type sub-pixel 1003 and a fourth type sub-pixel 1004, while the third sub-pixels 30 do not include the four types of sub-pixels.

For example, as shown in FIG. 9, at least one first pixel row 01 includes a plurality of first pixel groups 010, each first pixel group 010 includes eight sub-pixels, and each first pixel group 010 includes a first type sub-pixel 1001, a second type sub-pixel 1002, a third type sub-pixel 1003 and a fourth type sub-pixel 1004. For example, the display substrate includes at least one display region, and each first pixel row 01 located at the non-edge position of the display region includes a plurality of first pixel groups 010. For example, each first pixel row 01 in the display substrate includes a plurality of first pixel groups 010.

For example, the plurality of first sub-pixels 10 (i.e., red sub-pixels) in each first pixel group 010 include a first type sub-pixel 1001, a second type sub-pixel 1002, a third type sub-pixel 1003 and a fourth type sub-pixel 1004, while the four third sub-pixels 30 do not include the four types of sub-pixels, that is, the four third sub-pixels 30 in each first pixel group 010 have the same shape, the same size and the same arrangement state.

For example, as shown in FIG. 9, at least one first pixel column 03 includes a plurality of second pixel groups 020, each second pixel group 020 includes eight sub-pixels 100, and each second pixel group 020 includes a first type sub-pixel 1001, a second type sub-pixel 1002, a third type sub-pixel 1003 and a fourth type sub-pixel 1004. For example, the display substrate includes at least one display region, and each first pixel column 03 located at the non-edge position of the display region includes a plurality of second pixel groups 020. For example, each first pixel column 03 in the display substrate includes a plurality of second pixel groups 020.

For example, the plurality of first sub-pixels 10 (i.e., red sub-pixels) in each second pixel group 020 include a first type sub-pixel 1001, a second type sub-pixel 1002, a third type sub-pixel 1003 and a fourth type sub-pixel 1004, while four third sub-pixels 30 do not include the four types of sub-pixels as mentioned above, that is, the four third sub-pixels 30 in each second pixel group 020 have the same shape, the same size and the same arrangement state.

For example, as shown in FIG. 9, the sub-pixels arranged along the extending direction of one of the first diagonal line and the second diagonal line of the virtual quadrilateral include a plurality of third pixel groups 030, each third pixel group 030 includes eight sub-pixels, and each third pixel group 030 includes a first type sub-pixel 1001, a second type sub-pixel 1002, a third type sub-pixel 1003 and a fourth type sub-pixel 1004.

For example, each third pixel group 030 includes four first sub-pixels 10 and four second sub-pixels 20. The four first sub-pixels 10 in each third pixel group 030 can be a first type sub-pixel 1001, a second type sub-pixel 1002, a third type sub-pixels 1003 and a fourth type sub-pixels 1004, respectively, while the four second sub-pixels 20 do not include the four types of sub-pixels as mentioned above, that is, the four second sub-pixels 20 in each third pixel group 030 have the same shape, the same size and the same arrangement state.

For example, as shown in FIG. 9, the sub-pixels arranged along the extending direction of the other of the first diagonal line and the second diagonal line of the virtual quadrilateral include a plurality of fourth pixel groups 040, each fourth pixel group 040 includes four sub-pixels, and each fourth pixel group 040 includes two types of sub-pixels among the first type sub-pixel 1001, the second type sub-pixel 1002, the third type sub-pixel 1003 and the fourth type sub-pixel 1004.

For example, as shown in FIG. 9, each fourth pixel group 040 includes two first sub-pixels 10 and two second sub-pixels 20. The two first sub-pixels 10 in each fourth pixel group 040 can be any two types of the first type sub-pixel 1001, the second type sub-pixel 1002, the third type sub-pixel 1003 and the fourth type sub-pixel 1004, while the two second sub-pixels 20 do not include the four types of sub-pixels as mentioned above, that is, the two second sub-pixels 20 in each fourth pixel group 040 have the same shape, the same size and the same arrangement state.

In the display substrate provided by the present example, the first pixel group, the second pixel group and the third pixel group, all of which include the above four different types of sub-pixels, are respectively arranged in the row direction, the column direction and one oblique direction, and the fourth pixel group including the two different types of sub-pixels is arranged in the other oblique direction, which can further alleviate the problem of color shift when the display substrate displays details such as a horizontal line, a vertical line and an oblique line, etc.

For example, as shown in FIG. 9, four first sub-pixels 10 surrounding each third sub-pixel 30 are one first type sub-pixel 1001, one second type sub-pixel 1002, one third type sub-pixel 1003 and one fourth type sub-pixel 1004, respectively.

In the embodiments of the present disclosure, by setting the four first sub-pixels surrounding the third sub-pixel to include four different types of sub-pixels, it is helpful to reduce color shift and homogenize the visual effect in terms of displaying a detailed image which includes a small number of sub-pixels.

Of course, in the case where the first sub-pixels include four types of sub-pixels, the arrangement rule of the four types of sub-pixels is not limited to the pixel arrangement shown in FIG. 9, but also can be the arrangement rule of the four types of sub-pixels included in the third sub-pixel in the display substrate as shown in FIG. 1, FIG. 6 or FIG. 8, etc., which is not limited in the embodiments of the present disclosure.

In the present example, the length relationship of straight sides between angle portions in the first sub-pixel can be the same as the length relationship of straight sides between angle portions in the third sub-pixel in the example shown in FIG. 1, which will not be repeated here.

In the present example, the relationship with respect to the distances between the angle portions of the first sub-pixel and the corresponding angle portions of the adjacent third sub-pixels can be the same as the relationship with respect to the distances between the angle portions of the third sub-pixel and the corresponding angle portions of the adjacent first sub-pixels in the example shown in FIG. 1, which will not be repeated here.

Figure 10:
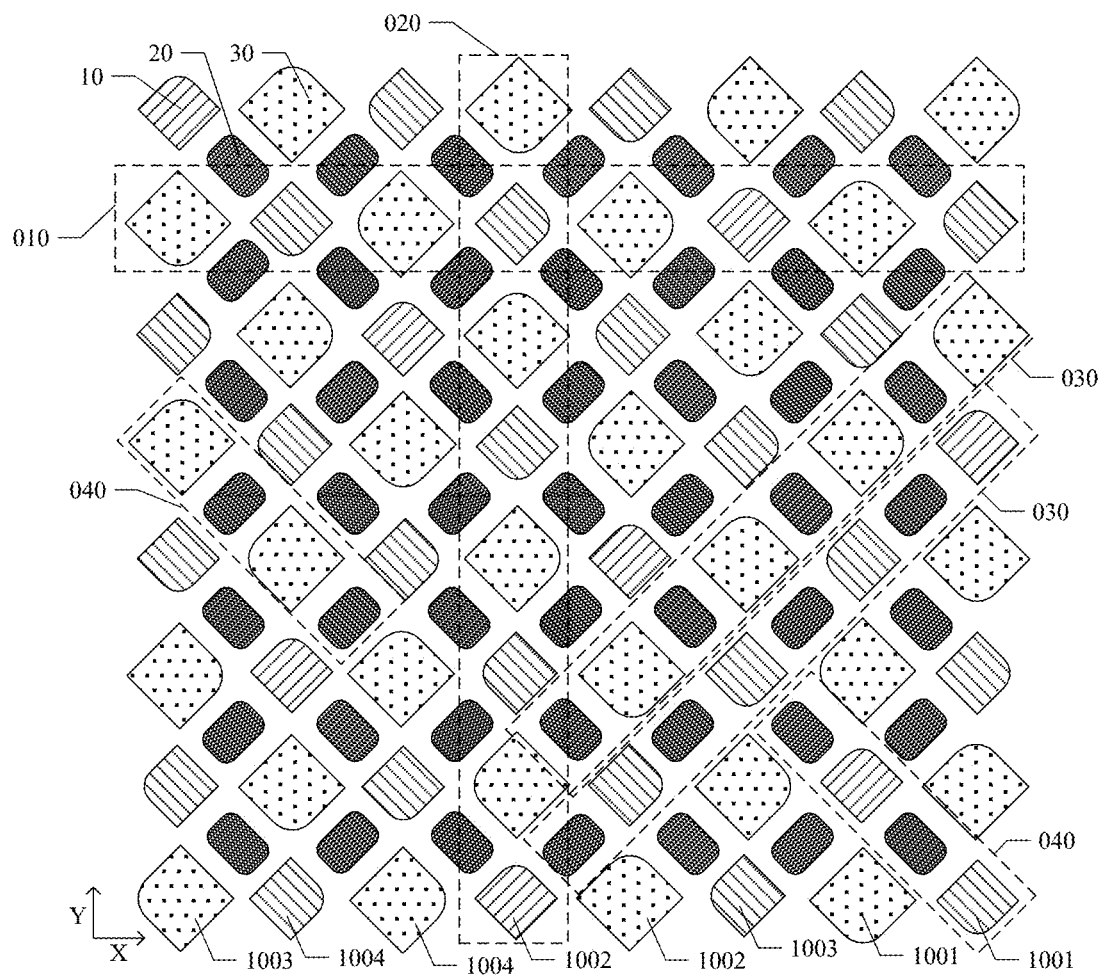
FIG. 10 is a partial planar structural view of a pixel arrangement in a display substrate provided by another example of the embodiment of the present disclosure.

For example, FIG. 10 is a partial planar structural view of pixel arrangement in a display substrate provided by another example of the embodiment of the present disclosure. The display substrate provided by the example shown in FIG. 10 differs from the display substrates provided by the examples shown in FIGS. 1-9 in that the first sub-pixels 10 and the third sub-pixels 30 respectively include first type sub-pixels 1001, second type sub-pixels 1002, third type sub-pixels 1003 and fourth type sub-pixels 1004.

For example, as shown in FIG. 10, all of the first pixel group 010, the second pixel group 020 and the third pixel group 030 include eight sub-pixels, and the fourth sub-pixel group 040 includes four sub-pixels.

For example, as shown in FIG. 10, both the first pixel group 010 and the second pixel group 020 include two first type sub-pixels 1001, two second type sub-pixels 1002, two third type sub-pixels 1003 and two fourth type sub-pixels 1004.

For example, in the same pixel group, the arrangement order of the four types of sub-pixels included in the first sub-pixels 10 can be the same as or different from the four types of sub-pixels included in the third sub-pixels 30.

For example, as shown in FIG. 10, the third pixel group 030 can include two kinds of pixel arrangements. For example, the third pixel group 030 can include four first sub-pixels 10 and four second sub-pixels 20, and the four first sub-pixels 10 can be a first type sub-pixel 1001, a second type sub-pixels 1002, a third type sub-pixel 1003 and a fourth type sub-pixel 1004, respectively.

For example, as shown in FIG. 10, the third pixel group 030 can also include four third sub-pixels 30 and four second sub-pixels 20, and the four third sub-pixels 30 can be a first type sub-pixel 1001, a second type sub-pixel 1002, a third type sub-pixel 1003 and a fourth type sub-pixel 1004, respectively.

For example, as shown in FIG. 10, the fourth pixel group 040 can include two kinds of pixel arrangements. For example, the fourth pixel group 040 can include two first sub-pixels 10 and two second sub-pixels 20, and the two first sub-pixels 10 include two types of sub-pixels.

For example, as shown in FIG. 10, the fourth pixel group 040 can include two third sub-pixels 30 and two second sub-pixels 20, and the two third sub-pixels 30 include two types of sub-pixels.

In the display substrate provided by the present example, the first pixel group, the second pixel group and the third pixel group, all of which include the above four different types of sub-pixels, are respectively arranged in the row direction, the column direction and one oblique direction, and the fourth pixel group including the two different types of sub-pixels is arranged in the other oblique direction, which can further alleviate the problem of color shift when the display substrate displays details such as a horizontal line, a vertical line and an oblique line, etc.

For example, as shown in FIG. 10, four first sub-pixels 10 surrounding each third sub-pixel 30 are one first type sub-pixel 1001, one second type sub-pixel 1002, one third type sub-pixel 1003 and one fourth type sub-pixel 1004, respectively, and four third sub-pixels 30 surrounding each first sub-pixel 10 are one first type sub-pixel 1001, one second type sub-pixel 1002, one third type sub-pixel 1003 and one fourth type sub-pixel 1004, respectively.

In the embodiments of the present disclosure, by setting the four first sub-pixels surrounding the third sub-pixel to include four different types of sub-pixels and setting the four third sub-pixels surrounding the first sub-pixel to include four different types of sub-pixels, it is helpful to reduce color shift and homogenize the visual effect in terms of displaying a detailed image which includes a small number of sub-pixels.

Of course, in the case where both the first sub-pixels and the third sub-pixels include four types of sub-pixels, the arrangement rule of the four types of sub-pixels included in each kind of sub-pixels is not limited to the pixel arrangement shown in FIG. 10, and the arrangement rule of the four types of sub-pixels included in each kind of sub-pixels can be the arrangement rule of the four types of sub-pixels included in the third sub-pixels in the display substrate as shown in FIG. 1, FIG. 6 or FIG. 8, etc., which is not limited in the embodiments of the present disclosure.

In the present example, the length relationship of straight sides between angle portions in the first sub-pixel can be the same as the length relationship of straight sides between angle portions in the third sub-pixel in the example shown in FIG. 1; and in the present example, the length relationship of straight sides between angle portions in the third sub-pixel can be the same as the length relationship of straight sides between angle portions in the third sub-pixel in the example shown in FIG. 1, which will not be repeated here.

In the present example, the relationship with respect to the distances between the angle portions of the first sub-pixel and the corresponding angle portions of the adjacent third sub-pixels can be the same as the relationship with respect to the distances between the angle portions of the third sub-pixel and the corresponding angle portions of the adjacent first sub-pixels in the example shown in FIG. 1; and in the present example, the relationship with respect to the distances between the angle portions of the third sub-pixel and the corresponding angle portions of the adjacent first sub-pixels can be the same as the relationship with respect to the distances between the angle portions of the third sub-pixel and the corresponding angle portions of the adjacent first sub-pixels in the example shown in FIG. 1, which will not be repeated here.

For example, the pixel arrangement structures shown in FIGS. 1-10 can be located at the edge of the display region of the display substrate, or can be located at the non-edge of the display region of the display substrate, without being limited in the embodiments of the present disclosure.

For example, the embodiments of the present disclosure are not limited to the case in which each first pixel row includes the first pixel groups and/or each first pixel column includes the second pixel groups; and at least one first pixel row can also include one, two or three types of the four types of sub-pixels, and at least one first pixel column can also include one, two or three types of the four types of sub-pixels, which is not limited in the embodiments of the present disclosure, as long as the plurality of sub-pixels included in the display substrate include the above four types of sub-pixels.

Figure 11:
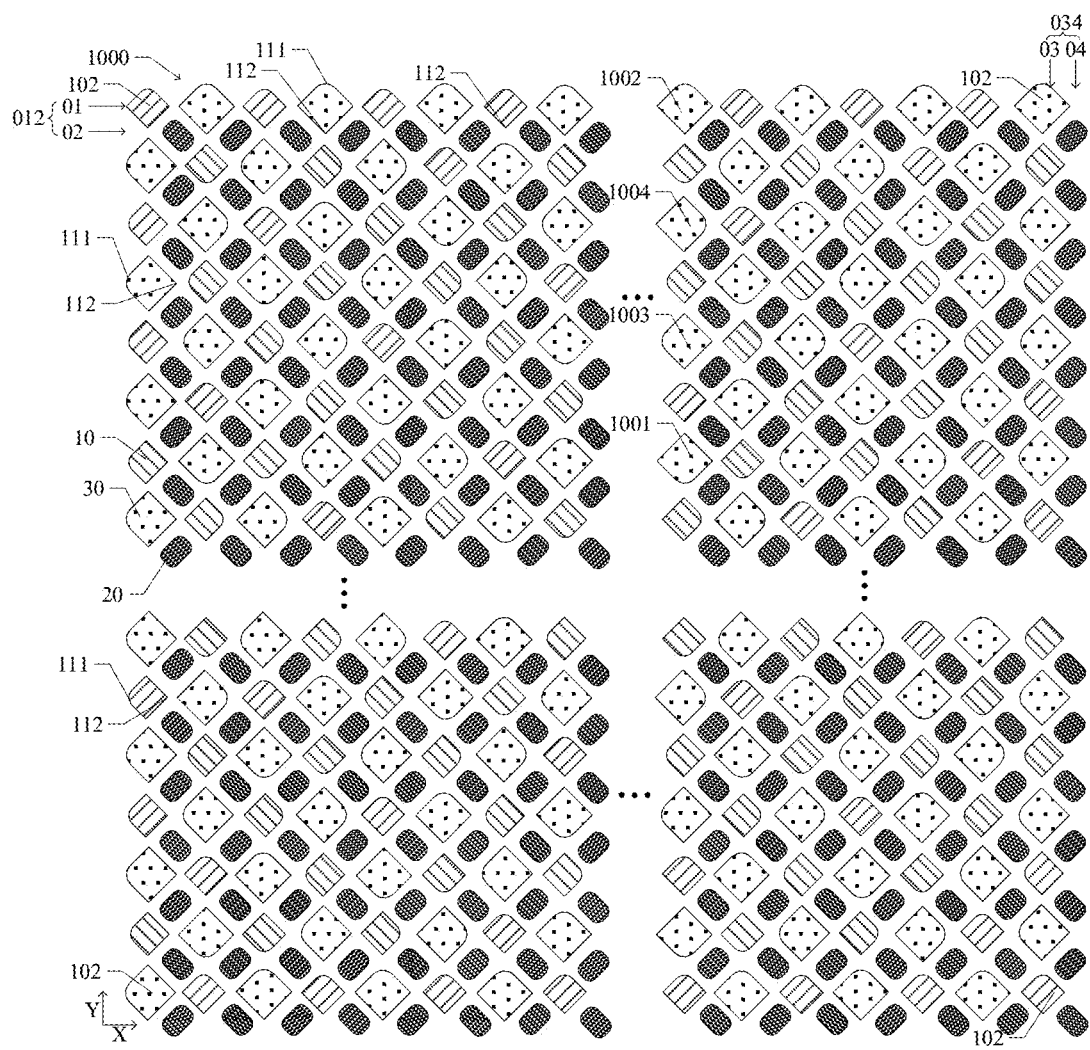
FIG. 11 is a partial planar structural view of a pixel arrangement in a display substrate provided by another example of the embodiment of the present disclosure.

For example, FIG. 11 is a partial planar structural view of pixel arrangement in a display substrate provided by another example of the embodiment of the present disclosure. As shown in FIG. 11, the display substrate includes at least one display region 1000, and FIG. 11 illustratively shows one display region included in the display substrate. The display region includes pixel rows and pixel columns at the peripheral edges. The embodiments of the present disclosure are not limited to this case, and the display substrate can also include a plurality of display regions. For example, the display substrate can be a foldable display substrate; according to a folding requirement, the display substrate can include two display regions, four display regions or more display regions, and each display region includes pixel rows and pixel columns at the peripheral edges. For example, in the case where two display regions included in the display substrate are adjacent, the pixel rows or pixels columns at the edges of the two display regions can also be adjacent to each other. Although the two pixel rows or two pixel columns respectively located at the edges of the two display regions are not located at the edge of the display substrate, they can be designed according to the requirements of each display region for edge pixels.

For example, as shown in FIG. 11, the first pixel row 01 and the second pixel row 02 located at the outermost edge of at least one display region 100 and adjacent to each other constitute an edge pixel row group 012, and for example, each display region 1000 can include two edge pixel row groups 012; and the first pixel column 03 and the second pixel column 04 located at the outermost edge of at least one display region 1000 and adjacent to each other constitute an edge pixel column group 034, and for example, each display region 1000 can include two edge pixel column groups 034. Corner sub-pixels 102 are arranged at the intersection position of the edge pixel row group 012 and the edge pixel column group 034, and the corner sub-pixels 102 include the first sub-pixel 10 and the third sub-pixel 30. For example, there are four corner sub-pixels 102, including two first sub-pixels 10 and two third sub-pixels 30, at the intersection positions of two edge pixel row groups 012 and two edge pixel column groups 034. The outermost edge of the display region refers to the edge where the display region can be lit, and a dummy region can be set at the position at the outer side of the edge pixel row group (and edge pixel column group) at the edge of the display region, and the dummy region will not be lit. Of course, the outermost edge of the display region can also refer to the last row (and the last column) of openings of the pixel defining layer and the first row (and first column) of openings of the pixel defining layer.

For example, as shown in FIG. 11, in the edge pixel row group 012, at least one of the first sub-pixel 10 and the third sub-pixel 30 other than the corner sub-pixels 102 includes a first angle portion 111 and a second angle portion 112, and the second angle portion 112 is closer to the second pixel row 02 than the first angle portion 111 is. For example, the first pixel row 01 of the edge pixel row group 012 includes only one type of sub-pixels, such as the second type sub-pixels 1002.

In a common display substrate, the shapes of the four vertex angles included in the light emitting regions of the sub-pixels with different colors are all the same, so the two pixel rows located at the upper and lower edges of the display region are one pixel row including red sub-pixels and blue sub-pixels, and one pixel row including green sub-pixels, respectively. In the case where one pixel row including red sub-pixels and blue sub-pixels serves as the outermost pixel row, the side edge is prone to appear purple when displaying. In the case where one pixel row including green sub-pixels serves as the outermost pixel row, the side edge is prone to appear cyan when displaying. In addition, the edge of the light emitting region of this display substrate can also cause a jagged edge when displaying due to the protruding angle portions of the pixels.

Compared with the pixel arrangement of the common display substrate, the display substrate provided by the embodiments of the present disclosure modifies the shapes of the sub-pixels in the edge pixel row of the display region, so that the second angle portion of at least one of the blue sub-pixel and the red sub-pixel in the edge pixel row group is located at one side of the first angle portion close to the green sub-pixel row in the edge pixel row group, so that the brightness center of the at least one of the blue sub-pixel and the red sub-pixel shifts to the green sub-pixel, so as to alleviate the phenomenon that the edge pixel row appears purple or cyan. In addition, in the case where the pixel row at the outmost edge is the first pixel row including blue sub-pixels and red sub-pixels, a rounded angle with a relatively long arc length is used as the first angle portion at the edge side, which is helpful to alleviate the feeling of jagged edge.

For example, as shown in FIG. 11, in the edge pixel column group 034, at least one of the first sub-pixel 10 and the third sub-pixel 30 other than the corner sub-pixels 102 includes a first angle portion 111 and a second angle portion 112, and the second angle portion 112 is closer to the second pixel column 02 than the first angle portion 111 is. For example, the first pixel column 03 of the edge pixel column group 034 includes only one type of sub-pixel, such as the third type sub-pixels 1003.

In a common display substrate, the shapes of the four vertex angles included in the light emitting regions of the sub-pixels with different colors are all the same, so the two pixel columns located at the left and right edges of the display region are one pixel column including red sub-pixels and blue sub-pixels, and one pixel column including green sub-pixels, respectively. In the case where one pixel column including red sub-pixels and blue sub-pixels serves as the outermost pixel column, the side edge is prone to appear purple when displaying. In the case where one pixel column including green sub-pixels serves as the outermost pixel column, the side edge is prone to appear cyan when displaying. In addition, the edge of the light emitting region of this display substrate can also cause a jagged edge when displaying due to the protruding angle portions of the pixels.

Compared with the pixel arrangement of the common display substrate, the display substrate provided by the embodiments of the present disclosure modifies the shapes of the sub-pixels in the edge pixel column of the display region, so that the second angle portion of at least one of the blue sub-pixel and the red sub-pixel in the edge pixel column group is located at one side of the first angle portion close to the green sub-pixel column in the edge pixel column group, so that the brightness center of the at least one of the blue sub-pixel and the red sub-pixel shifts to the green sub-pixel, so as to alleviate the phenomenon that the edge pixel column appears purple or cyan. In addition, in the case where the pixel column at the outmost edge is the first pixel column including blue sub-pixels and red sub-pixels, a rounded angle with a relatively long arc length is used as the first angle portion at the edge side, which is helpful to alleviate the feeling of jagged edge.

For example, as shown in FIG. 11, except for the first pixel row 01 located in the edge pixel row group 012, each first pixel row 01 includes a first type sub-pixel 1001, a second type sub-pixel 1002, a third type sub-pixel 1003 and a fourth type sub-pixel 1004. For example, as shown in FIG. 11, except for the first pixel column 03 located in the edge pixel column group 034, each first pixel column 03 includes a first type sub-pixel 1001, a second type sub-pixel 1002, a third type sub-pixel 1003 and a fourth type sub-pixel 1004.

Therefore, the display substrate provided by the embodiments of the present disclosure, by adjusting the shape and arrangement rule of at least one of the first sub-pixel and the third sub-pixel to adjust the position of brightness center, can not only make the brightness center distribution of the sub-pixels in the non-edge region of the display region more uniform, but also alleviate color shift, and further improve the phenomenon that the edge of the display region appears purple or blue and the feeling of jagged edge.

For example, FIG. 11 illustratively shows that both the edge pixel row group and the edge pixel column group include sub-pixels with the above-mentioned angle portion positional relationship, but it is not limited to this case, and it may be that only the edge pixel row group or the edge pixel column group includes sub-pixels with the above-mentioned angle portion positional relationship. The above-mentioned angle portion positional relationship refers to the positional relationship between the first angle portion and the second angle portion of at least one of the first sub-pixel and the third sub-pixel, and the second pixel row in the first pixel row group or the positional relationship between the first angle portion and the second angle portion of at least one of the first sub-pixel and the third sub-pixel, and the second pixel column in the first pixel column group.

For example, as shown in FIG. 11, in the edge pixel row group 012, the first sub-pixel 10 and the third sub-pixel 30 other than the corner sub-pixels 102 both include a first angle portion 111 and a second angle portion 112, and the second angle portion 112 is located at a side of the first angle portion 111 close to the second sub-pixel row 02; and in the edge pixel column group 034, the first sub-pixel 10 and the third sub-pixel 30 other than the corner sub-pixels 102 both include a first angle portion 111 and a second angle portion 112, and the second angle portion 112 is located at a side of the first angle portion 111 close to the second sub-pixel column 04.

For example, both the first pixel row in the edge pixel row group and the first pixel column in the edge pixel column group include only one type of sub-pixels, and the type of sub-pixels included in the edge pixel row group is different from the type of sub-pixels included in the edge pixel column group. For example, the direction in which the first angle portion points to the second angle portion in the sub-pixel of the edge pixel row group is intersected with the direction in which the first angle portion points to the second angle portion in the sub-pixel of the edge pixel column group. For example, the direction in which the first angle portion points to the second angle portion in the sub-pixel of the edge pixel row group is parallel to the column direction, and the direction in which the first angle portion points to the second angle portion in the sub-pixel of the edge pixel column group is parallel to the row direction.

An example of an embodiment of the present disclosure can better alleviate the phenomenon that the edge of the display region appears purple or cyan by setting the blue sub-pixel and the red sub-pixel as sub-pixels with the above-mentioned angle portion positional relationship to shift the brightness centers of the blue sub-pixel and the red sub-pixel at the edges to the green sub-pixel. The above-mentioned angle portion positional relationship refers to the positional relationship between the first angle portion and the second angle portion of at least one of the first sub-pixel and the third sub-pixel, and the second pixel row in the first pixel row group, or the positional relationship between the first angle portion and the second angle portion of at least one of the first sub-pixel and the third sub-pixel, and the second pixel column in the first pixel column group.

For example, as shown in FIG. 11, the direction in which the first angle portion 111 points to the second angle portion 112 in the corner sub-pixel 102 can be the same as the direction in which the first angle portion 111 points to the second angle portion 112 in the sub-pixel of the edge pixel row group 012 where the corner sub-pixel 102 is located, or can be the same as the direction in which the first angle portion 111 points to the second angle portion 112 in the sub-pixel of the edge pixel column group 034 where the corner sub-pixel 102 is located, which is not limited in the embodiments of the present disclosure.

Figure 12:
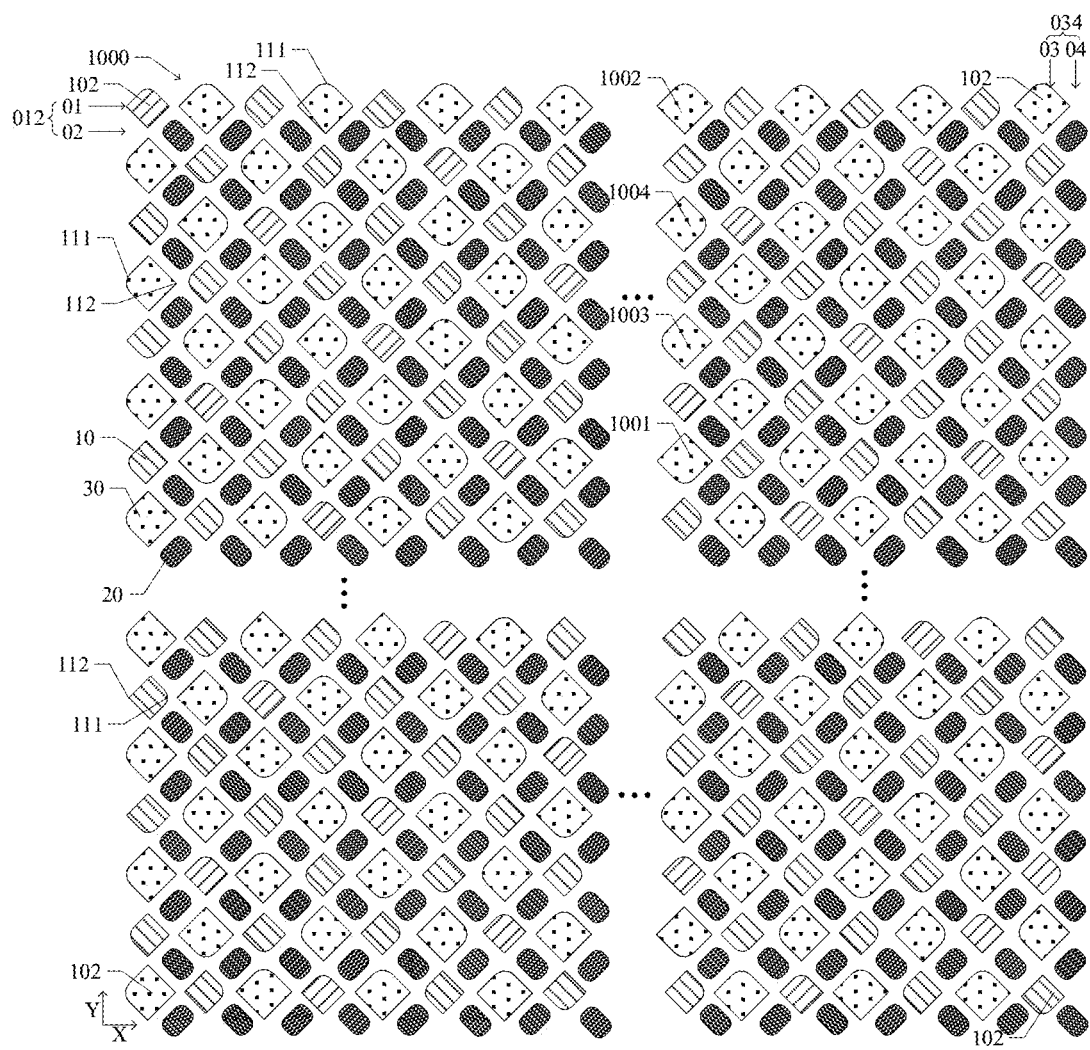
FIG. 12 is a partial planar structural view of a pixel arrangement in a display substrate provided by another example of the embodiment of the present disclosure.

For example, FIG. 12 is a partial planar structural view of pixel arrangement in a display substrate provided by another example of the embodiment of the present disclosure. The example shown in FIG. 12 differs from the example shown in FIG. 11 in that in at least one of the edge pixel row group 012 and the edge pixel column group 034, only the second angle portion 112 of the third sub-pixel 30 is located at a side of the first angle portion 111 of the third sub-pixel 30 close to the second pixel row 02 or the second pixel column 04, while the first sub-pixels 10 located in at least one of the edge pixel row group 012 and the edge pixel column group 034 include four types of sub-pixels; that is, in at least one of the edge pixel row group 012 and the edge pixel column group 034, the first sub-pixels 10 include four types of sub-pixels, and the third sub-pixels 30 include only one type of sub-pixels.

In the present example, the third sub-pixel in at least one of the edge pixel row group and the edge pixel column group of the display region is set so that the second angle portion of the third sub-pixel is located at a side of the first angle portion close to the second pixel row or the second pixel column to adjust the position of the brightness center of the third sub-pixel at the edge, which is helpful to alleviate the phenomenon that the edge of the display region appears purple or cyan. In addition, the first sub-pixels in at least one of the edge pixel row group and the edge pixel column group of the display region are set to include four different types of sub-pixels, which is also helpful to reduce the problem of color shift when displaying details such as a horizontal line or a vertical line, etc., at the edge.

Of course, the embodiments of the present disclosure are not limited to this case. In another example of the present disclosure, in at least one of the edge pixel row group and the edge pixel column group, only the second angle portion of the first sub-pixel is located at a side of the first angle portion close to the second pixel row or the second pixel column, while the third sub-pixels located in at least one of the edge pixel row group and the edge pixel column group include four types of sub-pixels. For example, in at least one of the edge pixel row group and the edge pixel column group, the third sub-pixels include four types of sub-pixels, and the first sub-pixels include only one type of sub-pixels. In the present example, the first sub-pixel in at least one of the edge pixel row group and the edge pixel column group of the display region is set so that the second angle portion of the first sub-pixel is located at a side of the first angle portion close to the second pixel row or the second pixel column to adjust the position of the brightness center of the first sub-pixel at the edge, which is helpful to improve the phenomenon that the edge of the display region appears purple or cyan. In addition, setting the third sub-pixels in at least one of the edge pixel row group and the edge pixel column group of the display region to include four different types of sub-pixels is also helpful to reduce the problem of color shift when displaying details such as a horizontal line or a vertical line, etc., at the edge.

Figure 13:
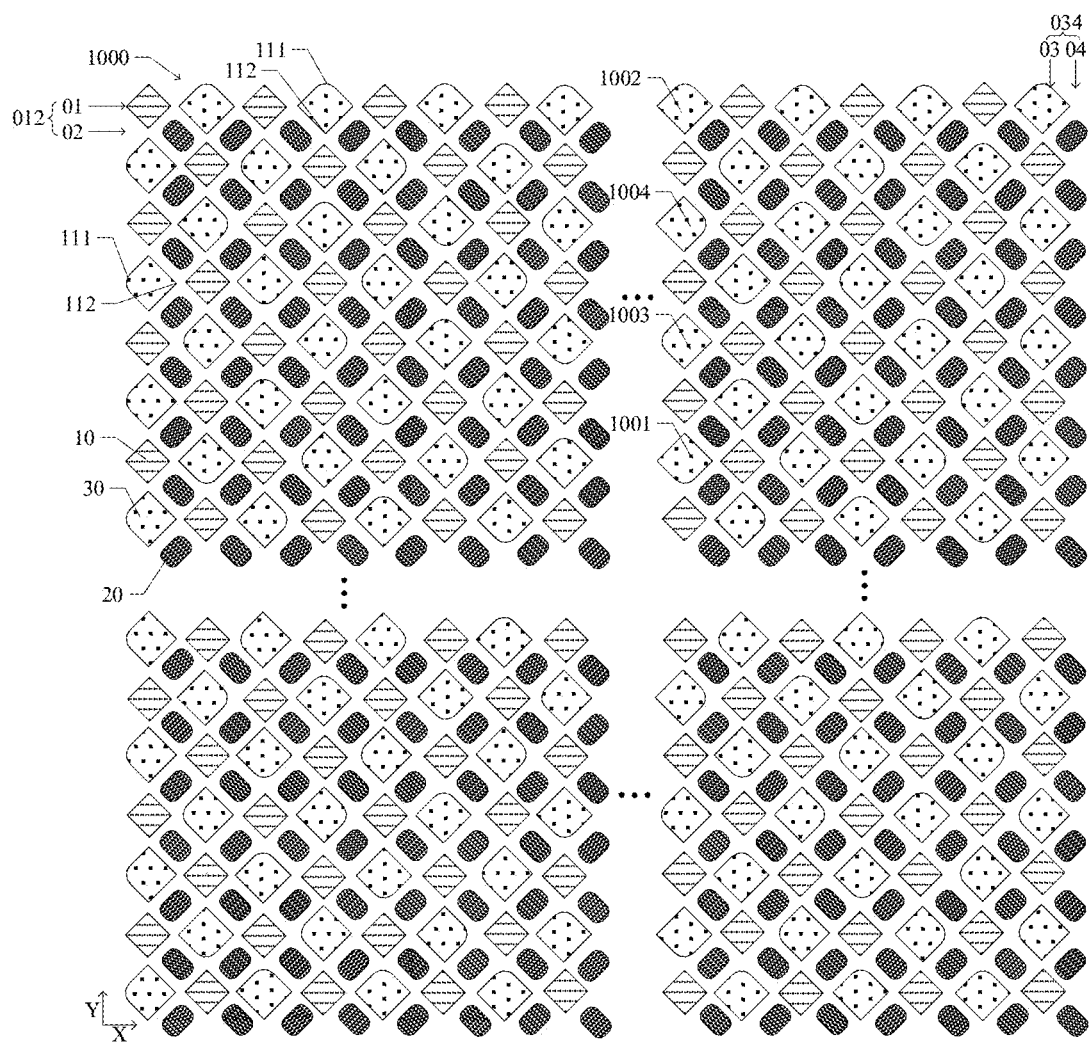
FIG. 13 is a partial planar structural view of a pixel arrangement in a display substrate provided by another example of the embodiment of the present disclosure.

For example, FIG. 13 is a partial planar structural view of pixel arrangement in a display substrate provided by another example of the embodiment of the present disclosure. The example shown in FIG. 13 differs from the example shown in FIG. 12 in that in the display substrate shown in FIG. 13, only the third sub-pixels 30 include four types of sub-pixels, and the first sub-pixels 10 do not include four types of sub-pixels; that is, the plurality of first sub-pixels 10 in the display substrate have the same shape, the same size and the same arrangement state.

In the present example, the third sub-pixel in at least one of the edge pixel row group and the edge pixel column group of the display region is set so that the second angle portion of the third sub-pixel is located at a side of the first angle portion close to the second pixel row or the second pixel column to adjust the position of the brightness center of the third sub-pixel at the edge, which is helpful to improve the phenomenon that the edge of the display region appears purple or cyan.

Of course, the embodiments of the present disclosure are not limited to this case. In another example of the present disclosure, among the plurality of sub-pixels included in the display substrate, only the first sub-pixels include four types of sub-pixels, and the third sub-pixels do not include four types of sub-pixels, that is, the third sub-pixels in the display substrate have the same shape, the same size and the same arrangement state. The first sub-pixel in at least one of the edge pixel row group and the edge pixel column group of the display region is set so that the second angle portion of the first sub-pixel is located at a side of the first angle portion close to the second pixel row or the second pixel column to adjust the position of the brightness center of the first sub-pixel at the edge, which is helpful to improve the phenomenon that the edge of the display region appears purple or cyan.

Figure 14:
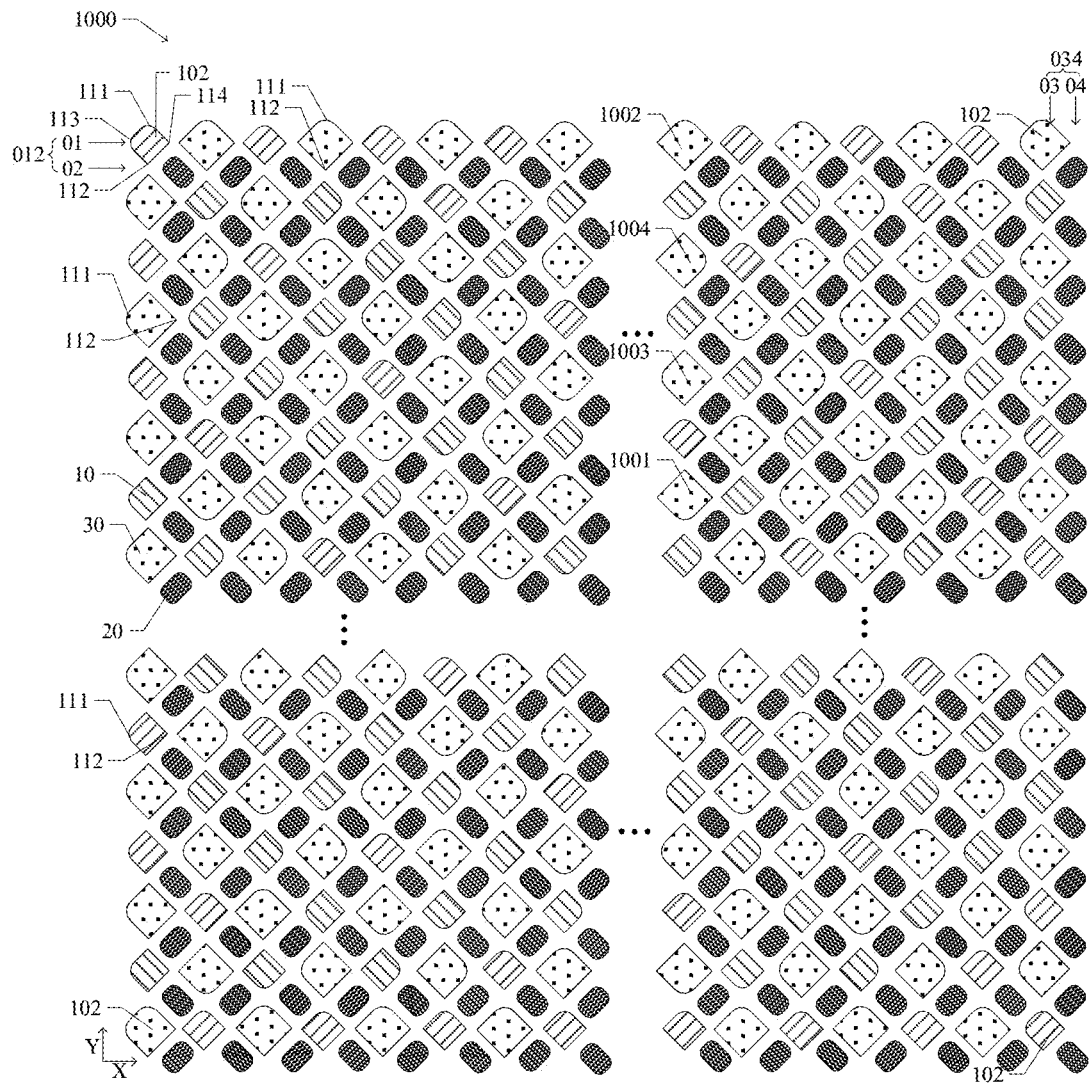
FIG. 14 is a partial planar structural view of a pixel arrangement in a display substrate provided by another example of the embodiment of the present disclosure.
Figure 15:
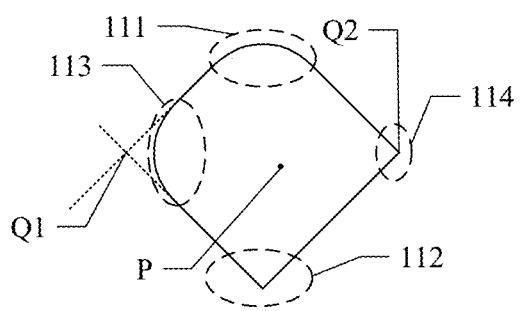
FIG. 15 is an enlarged view of one corner sub-pixel shown in FIG. 14.

For example, FIG. 14 is a partial planar structural view of pixel arrangement in a display substrate provided by another example of the embodiment of the present disclosure, and FIG. 15 is an enlarged view of one corner sub-pixel shown in FIG. 14. The example shown in FIG. 14 differs from the example shown in FIG. 11 in that the shape of the corner sub-pixel 102 of the display substrate in the present example is different from the shape of the corner sub-pixel 102 of the display substrate shown in FIG. 11.

For example, as shown in FIG. 14 and FIG. 15, in the corner sub-pixel 102, the distance between the intersection Q1 of extension lines of two straight sides constituting the third angle portion 113 and the center P of the sub-pixel 102 is greater than the distance between the intersection Q2 of two straight sides constituting the fourth angle portion 114 or extension lines thereof and the center P of the sub-pixel 102, and the fourth angle portion 114 is closer to the second pixel row 02 or the second pixel column 04 adjacent to the corner sub-pixel 102 than the third angle portion 113 is.

In the embodiments of the present disclosure, the shape relationship between the third angle portion and the fourth angle portion of the corner sub-pixel is adjusted to make the brightness center of the blue corner sub-pixel or the red corner sub-pixel located at the four corners of the display region shift to the adjacent green sub-pixel row and green sub-pixel column, which is helpful to alleviate the phenomenon that the angles of the display region appears purple or cyan.

For example, as shown in FIG. 14 and FIG. 15, in the corner sub-pixel 102, the shape of the first angle portion 111 can be approximately the same as the shape of the third angle portion 113, and the shape of the fourth angle portion 114 can be approximately the same as the shape of the second angle portion 112.

The example shown in FIG. 14 illustratively shows that the shapes and arrangement rules of sub-pixels other than the corner sub-pixels in the display region of the display substrate are the same as the shapes and arrangement rules of sub-pixels other than the corner sub-pixels in the display region of the display substrate shown in FIG. 11, but not limited thereto. The shapes of corner sub-pixels and the relationship between angle portions as shown in FIG. 14 can be applied to the display substrate provided by any of the above examples to improve the display effect at the angles of the display region.

Figure 16:
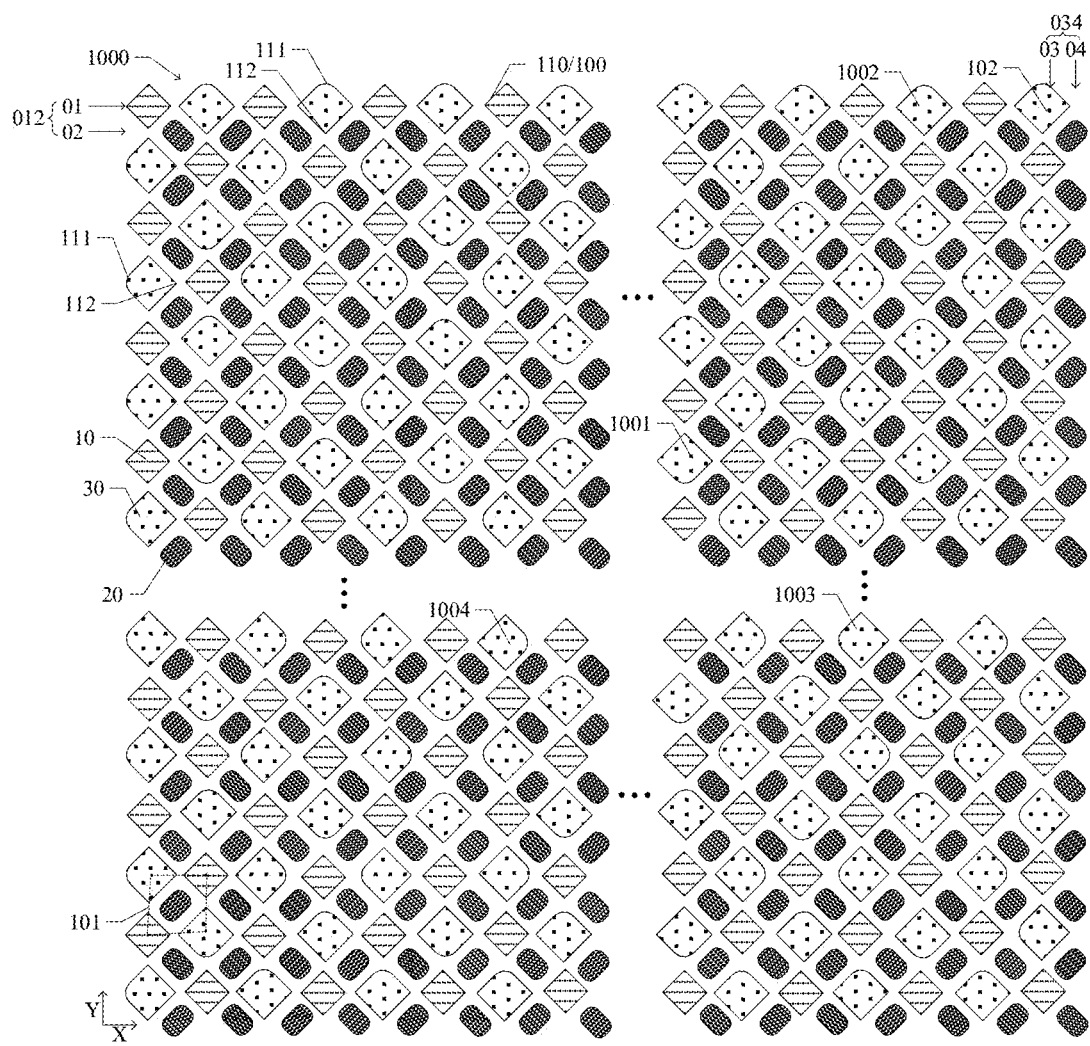
FIG. 16 is a partial structural view of a display substrate provided by an embodiment of the present disclosure.

FIG. 16 is a partial structural view of a display substrate provided by an embodiment of the present disclosure. As shown in FIG. 16, the display substrate includes a plurality of sub-pixels 100. As shown in FIG. 16, the plurality of sub-pixels 100 include a plurality of first sub-pixels 10, a plurality of second sub-pixels 20 and a plurality of third sub-pixels 30. The plurality of first sub-pixels 10 and the plurality of third sub-pixels 30 are alternately arranged along the row direction (X direction shown in FIG. 1) and the column direction (Y direction shown in FIG. 15) to form a plurality of first pixel rows 01 and a plurality of first pixel columns 03, the plurality of second sub-pixels 20 are arrayed along the row direction and the column direction to form a plurality of second pixel rows 02 and a plurality of second pixel columns 04, and the row direction is intersected with the column direction. For example, the row direction and the column direction can be perpendicular to each other. The row direction and the column direction can be interchanged.

As shown in FIG. 16, taking the centers of a certain first sub-pixel 10 and a certain third sub-pixel 30 adjacent to each other in the first pixel row 01, and the centers of a first sub-pixel 10 and a third sub-pixel 30, which are respectively adjacent to the adjacent first sub-pixel 10 and third sub-pixel 30 in the column direction, as four vertices of t a virtual quadrilateral 101, one second sub-pixel 20 is arranged in the virtual quadrilateral 101. For example, the second sub-pixel 20 is shifted with the first sub-pixel 10 and the third sub-pixel 30 in the adjacent first pixel row 01.

As shown in FIG. 16, each sub-pixel 100 includes a light emitting region 110, and the display substrate includes at least one display region 1000. FIG. 16 illustratively shows one display region included in the display substrate, and the display region includes pixel rows and pixel columns at the peripheral edges. The embodiments of the present disclosure are not limited to this case, and the display substrate can also include a plurality of display regions. For example, the display substrate can be a foldable display substrate; according to a folding requirement, the display substrate can include two display regions, four display regions or more display regions, and each display region includes pixel rows and pixel columns at the peripheral edges. For example, in the case where two display regions included in the display substrate are adjacent, the pixel rows or pixels columns at the edges of the two display regions can also be adjacent to each other. Although the two pixel rows or two pixel columns respectively located at the edges of the two display regions are not located at the edge of the display substrate, they can be designed according to the requirements of each display region for edge pixels.

As shown in FIG. 16, in at least one of the first sub-pixel 10 and the third sub-pixel 30 in the first pixel row 01 and the first pixel column 03 located at the outermost edge of the at least one display region 1000, the vertex angles of the light emitting region 110 include a first angle portion 111 and a second angle portion 112 which are oppositely arranged, and the distance between the intersection of extension lines of two straight sides constituting the first angle portion 111 and the center of the sub-pixel is greater than the distance between the intersection of two straight sides constituting the second angle portion 112 or extension lines thereof and the center of the sub-pixel. The sub-pixel including the first angle portion 111 and the second angle portion 112 in the present embodiment can have the same features and technical effects as the sub-pixel including the first angle portion 111 and the second angle portion 112 in the examples shown in FIGS. 1-14, which will not be repeated here.

As shown in FIG. 16, the first pixel row 01 and the second pixel row 02 located at the outermost edge of the at least one display region 1000 and adjacent to each other constitute an edge pixel row group 012, the first pixel column 03 and the second pixel column 04 located at the outermost edge of the at least one display region 1000 and adjacent to each other constitute an edge pixel column group 034, corner sub-pixels 102 are arranged at the intersection position of the edge pixel row group 012 and the edge pixel column group 034, and the corner sub-pixels 102 include the first sub-pixels 10 and the third sub-pixel 30. For example, there are four corner sub-pixels 102, including two first sub-pixels 10 and two third sub-pixels 30, at the intersection position of two edge pixel row groups 012 and two edge pixel column groups 034.

As shown in FIG. 16, in the sub-pixel 100 other than the corner sub-pixel 102 in the edge pixel row group 012, the second angle portion 112 is closer to the second pixel row 02 than the first angle portion 111 is.

In a common display substrate, the shapes of the four vertex angles included in the light emitting regions of the sub-pixels with different colors are all the same, so the two pixel rows located at the upper and lower edges of the display region are one pixel row formed of red sub-pixels and blue sub-pixels, and one pixel row formed of green sub-pixels, respectively. In the case where one pixel row formed of red sub-pixels and blue sub-pixels serves as the outermost pixel row, the side edge is prone to appear purple when displaying. In the case where one pixel row formed of green sub-pixels serves as the outermost pixel row, the side edge is prone to appear cyan when displaying. In addition, the edge of the light emitting region of this display substrate can also cause a jagged edge when displaying due to the protruding angle portions of the pixels.

Compared with the pixel arrangement of the common display substrate, the display substrate provided by the embodiments of the present disclosure modifies the shapes of the sub-pixels in the edge pixel row of the display region, so that the second angle portion of at least one of the blue sub-pixel and the red sub-pixel in the edge pixel row group is located at one side of the first angle portion close to the green sub-pixel row in the edge pixel row group, so that the brightness center of the at least one of the blue sub-pixel and the red sub-pixel shifts to the green sub-pixel, so as to alleviate the phenomenon that the edge pixel row appears purple or cyan. In addition, in the case where the pixel row at the outmost edge is the first pixel row formed of blue sub-pixels and red sub-pixels, a rounded angle with a relatively long arc length is used as the first angle portion at the edge side, which is helpful to alleviate the feeling of jagged edge.

As shown in FIG. 16, in the sub-pixel 100 other than the corner sub-pixel 102 of the edge pixel column group 034, the second angle portion 112 is closer to the second pixel column 04 than the first angle portion 111 is.

In a common display substrate, the shapes of the four vertex angles included in the light emitting regions of the sub-pixels with different colors are all the same, so the two pixel columns located at the left and right edges of the display region are one pixel column formed of red sub-pixels and blue sub-pixels, and one pixel column formed of green sub-pixels, respectively. In the case where one pixel column formed of red sub-pixels and blue sub-pixels serves as the outermost pixel column, the side edge is prone to appear purple when displaying. In the case where one pixel column formed of green sub-pixels serves as the outermost pixel column, the side edge is prone to appear cyan when displaying. In addition, the edge of the light emitting region of this display substrate can also cause a jagged edge when displaying due to the protruding angle portions of the pixels.

Compared with the pixel arrangement of the common display substrate, the display substrate provided by the embodiments of the present disclosure modifies the shapes of the sub-pixels in the edge pixel column of the display region, so that the second angle portion of at least one of the blue sub-pixel and the red sub-pixel in the edge pixel column group is located at a side of the first angle portion close to the green sub-pixel column in the edge pixel column group, so that the brightness center of the at least one of the blue sub-pixel and the red sub-pixel shifts to the green sub-pixel, so as to improve the phenomenon that the edge pixel column appears purple or cyan. In addition, in the case where the pixel column at the outmost edge is the first pixel column formed of blue sub-pixels and red sub-pixels, a rounded angle with a relatively long arc length is used as the first angle portion at the edge side, which is helpful to alleviate the feeling of jagged edge.

For example, as shown in FIG. 16, at least one kind of the first sub-pixels 10 and the third sub-pixels 30 in the display substrate includes four types of sub-pixels shown in FIG. 1, that is, a first type sub-pixel 1001, a second type sub-pixel 1002, a third type sub-pixel 1003 and a fourth type sub-pixel 1004. For example, among the sub-pixels located at the non-edge of the display region, the first pixel row 01 includes two types of sub-pixels, and the first pixel column 03 includes two types of sub-pixels. For example, the two types of sub-pixels included in each first pixel row 01 are alternately arranged. For example, the two types of sub-pixels included in each first pixel column 03 are alternately arranged.

For example, as shown in FIG. 16, two adjacent first pixel rows 01 include different types of sub-pixels. For example, one first pixel row 01 includes a first type sub-pixel 1001 and a second type sub-pixel 1002, and another first pixel row 01 adjacent to the first pixel row 01 includes a third type sub-pixel 1003 and a fourth type sub-pixel 1004. Similarly, two adjacent first pixel columns 03 include different types of sub-pixels. For example, one first pixel column 03 includes a first type sub-pixel 1001 and a second type sub-pixel 1002, and another first pixel column 03 adjacent to the first pixel column 03 includes a third type sub-pixel 1003 and a fourth type sub-pixel 1004.

Of course, the embodiments of the present disclosure are not limited to this case. The two types of sub-pixels included in each first pixel row can be one of the first type sub-pixel and the second type sub-pixel, and one of the third type sub-pixel and the fourth type sub-pixel; the two types of sub-pixels included in each first pixel column can be one of the first type sub-pixel and the second type sub-pixel, and one of the third type sub-pixel and the fourth type sub-pixel.

For example, as shown in FIG. 16, four third sub-pixels 30 surrounding the first sub-pixel 10 include four types of sub-pixels.

FIG. 16 illustratively shows that in at least one of the edge pixel row group and the edge pixel column group, the third sub-pixel includes a first angle portion and a second angle portion, while the first sub-pixel does not include the first angle portion and the second angle portion, but it is not limited to this case. And it can also be that in at least one of the edge pixel row group and the edge pixel column group, the first sub-pixel includes the first angle portion and the second angle portion, while the third sub-pixel does not include the first angle portion and the second angle portion.

Figure 17:
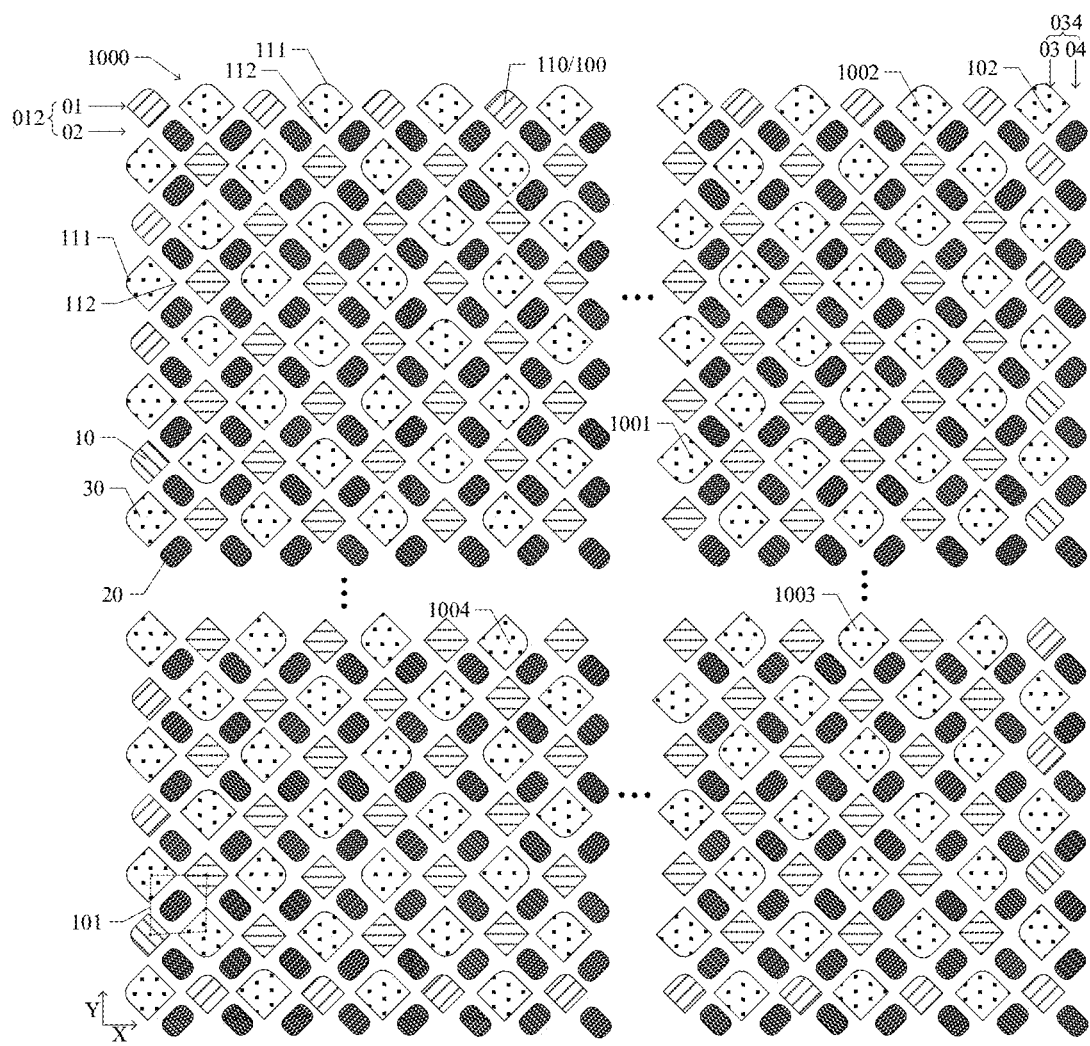
FIG. 17 is a partial planar structural view of a pixel arrangement in a display substrate provided by another example of the embodiment of the present disclosure.

For example, FIG. 17 is a partial planar structural view of pixel arrangement in a display substrate provided by another example of the embodiment of the present disclosure. The example shown in FIG. 17 differs from the example shown in FIG. 16 in that in the display substrate shown in FIG. 17, the first sub-pixel 10 and the third sub-pixel 30 other than the corner sub-pixels 102 in the edge pixel row group 012 both include the first angle portion 111 and the second angle portion 112, and the first sub-pixel 10 and the third sub-pixel 30 other than the corner sub-pixels 102 in the edge pixel column group 034 both include the first angle portion 111 and the second angle portion 112. In the present example, the distribution rule, shapes and other features of sub-pixels in the edge pixel row group and edge pixel column group and corresponding technical effects, can be the same as the distribution rule, shapes and other features of sub-pixels in the edge pixel row group and edge pixel column group and corresponding technical effects shown in FIG. 11, which will not be repeated here. Of course, the present example is not limited to this case. The distribution rule, shapes and other features of sub-pixels in the edge pixel row group and edge pixel column group and corresponding technical effects in the present example can also be the same as the distribution rule, shapes and other features of sub-pixels in the edge pixel row group and edge pixel column group and corresponding technical effects in the examples shown in FIGS. 12-13.

Figure 18:
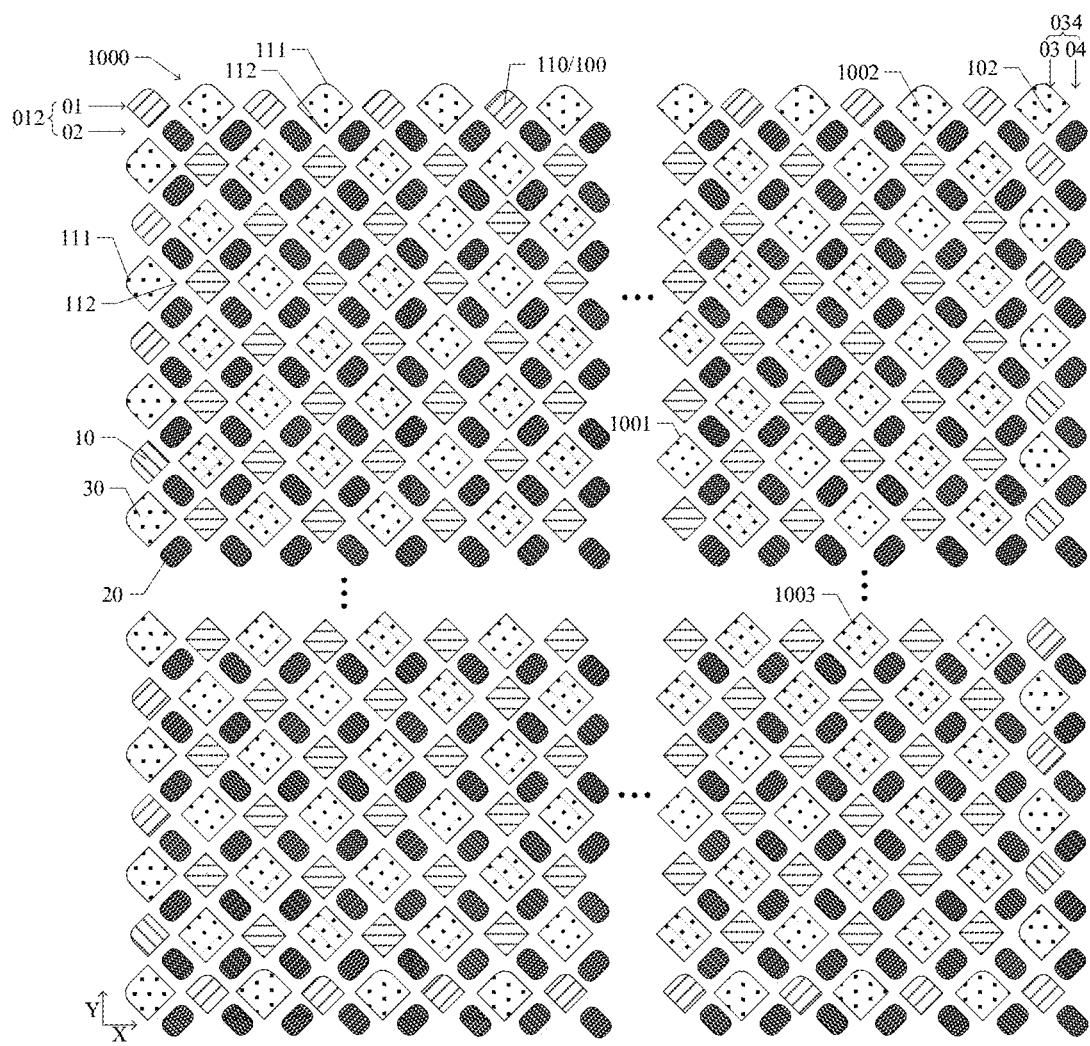
FIG. 18 is a partial planar structural view of a pixel arrangement in a display substrate provided by another example of the embodiment of the present disclosure.

For example, FIG. 18 is a partial planar structural view of pixel arrangement in a display substrate provided by another example of the embodiment of the present disclosure. The example shown in FIG. 18 differs from the example shown in FIG. 17 in that in the display substrate shown in FIG. 18, each sub-pixel located at the non-edge of the display region does not include the first angle portion and the second angle portion with the above features, that is, each sub-pixel located at the non-edge of the display region includes four angle portions with approximately the same shape. In the present example, the distribution rule, shapes and other features of sub-pixels in the edge pixel row group and edge pixel column group and corresponding technical effects, can be the same as the distribution rule, shapes and other features of sub-pixels in the edge pixel row group and edge pixel column group and corresponding technical effects shown in FIG. 11, which will not be repeated here. Of course, the present example is not limited to this case. The distribution rule, shapes and other features of sub-pixels in the edge pixel row group and edge pixel column group and corresponding technical effects in the present example can also be the same as the distribution rule, shapes and other features of sub-pixels in the edge pixel row group and edge pixel column group and corresponding technical effects in the examples shown in FIGS. 12-13.

For example, as shown in FIG. 18, the area of the third sub-pixel in at least one of the edge pixel row group and the edge pixel column group is less than the area of the third sub-pixel in the non-edge region in the at least one display region; and/or, the area of the first sub-pixel in at least one of the edge pixel row group and the edge pixel column group is less than the area of the first sub-pixel in the non-edge region in the at least one display region. For example, in the case where the shapes of the four angle portions included in each sub-pixel located at the non-edge of the display region are approximately the same, the shape of the first sub-pixel located at the edge of the display region is different from the shape of the first sub-pixel located at the non-edge of the display region, and the area of the first sub-pixel located at the edge of the display region is less than the area of the first sub-pixel located at the non-edge of the display region. For example, in the case where the shapes of the four angle portions included in each sub-pixel located at the non-edge of the display region are approximately the same, the shape of the third sub-pixel located at the edge of the display region is different from the shape of the third sub-pixel located at the non-edge of the display region, and the area of the third sub-pixel located at the edge of the display region is less than the area of the third sub-pixel located at the non-edge of the display region.

Figure 19:
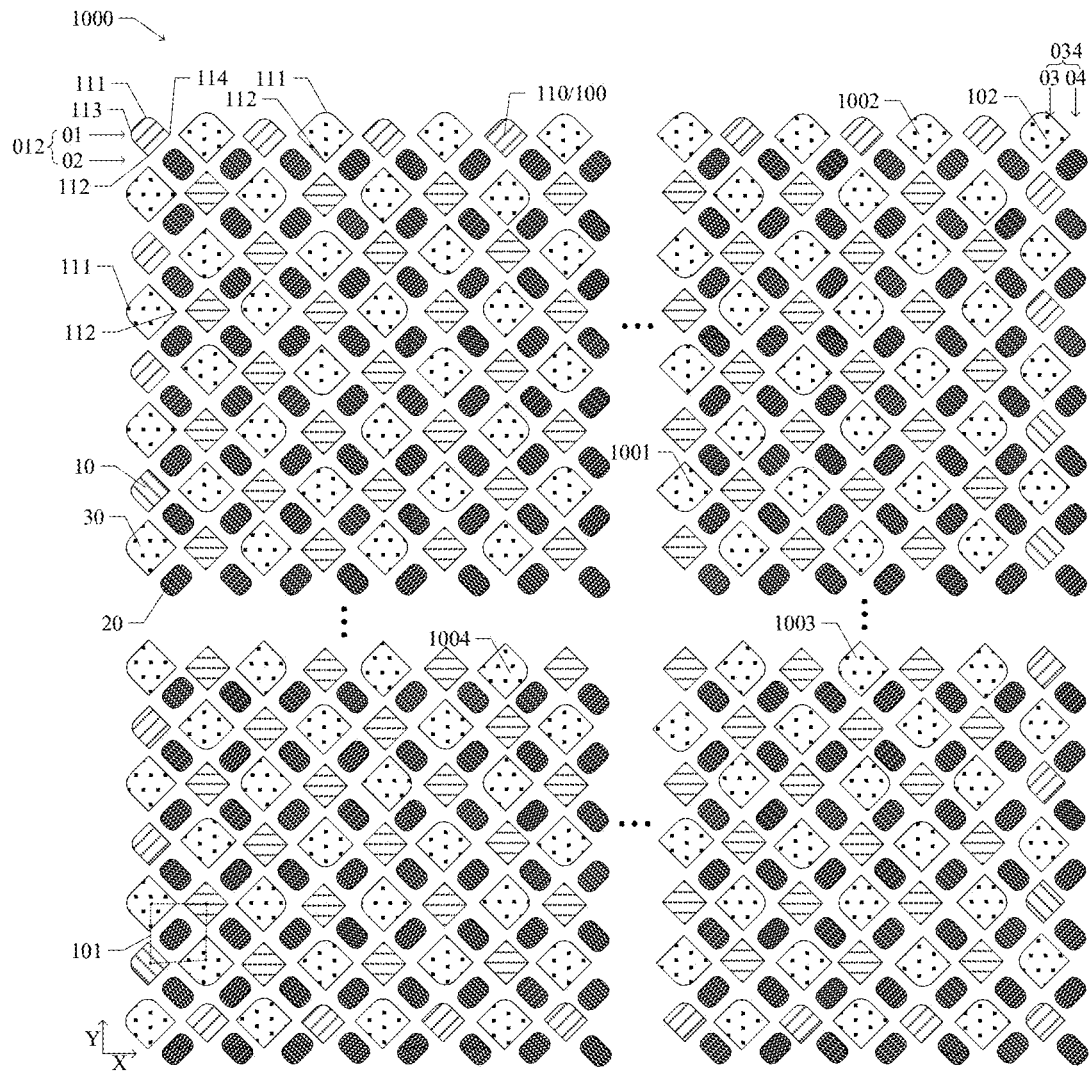
FIG. 19 is a partial planar structural view of a pixel arrangement in a display substrate provided by another example of the embodiment of the present disclosure.

For example, FIG. 19 is a partial planar structural view of pixel arrangement in a display substrate provided by another example of the embodiment of the present disclosure. The example shown in FIG. 19 differs from the example shown in FIG. 17 in that the shape of the corner sub-pixel 102 of the display substrate in the present example is different from the shape of the corner sub-pixel 102 of the display substrate shown in FIG. 17. The shape of the corner sub-pixel 102 in the present example can be the same as the shape of the corner sub-pixel 102 shown in FIG. 14 and FIG. 15. As shown in FIG. 19 and FIG. 15, the vertex angles of the light emitting region 110 of the corner sub-pixel 102 further includes a third angle portion 113 and a fourth angle portion 114 which are oppositely arranged; in the corner sub-pixel 102, the distance between the intersection Q1 of extension lines of two straight sides forming the third angle portion 113 and the center P of the sub-pixel 102 is greater than the distance between the intersection Q2 of two straight sides forming the fourth angle portion 114 or extension lines thereof and the center P of the sub-pixel 102, and the fourth angle portion 114 is closer to the second pixel row 02 or the second pixel column 04 adjacent to the corner sub-pixel 102 than the third angle portion 113 is.

The embodiments of the present disclosure, the shape relationship between the third angle portion and the fourth angle portion of the corner sub-pixel is adjusted to make the brightness center of the blue corner sub-pixel or the red corner sub-pixel located at the four corners of the display region shift to the adjacent green sub-pixel row and green sub-pixel column, which is helpful to alleviate the phenomenon that the angles of the display region appears purple or cyan.

For example, as shown in FIG. 19, in the corner sub-pixel 102, the shape of the first angle portion 111 can be approximately the same as the shape of the third angle portion 113, and the shape of the fourth angle portion 114 can be approximately the same as the shape of the second angle portion 112.

The example shown in FIG. 19 illustratively shows that the shapes and arrangement rules of sub-pixels other than the corner sub-pixels in the display region of the display substrate are the same as the shapes and arrangement rules of sub-pixels other than the corner sub-pixels in the display region of the display substrate shown in any of FIGS. 1-18, but not limited thereto. The shapes of corner sub-pixels and the relationship between angle portions as shown in FIG. 19 can be applied to the display substrate provided by any of the above examples to improve the display effect at the angles of the display region.

Figure 20:
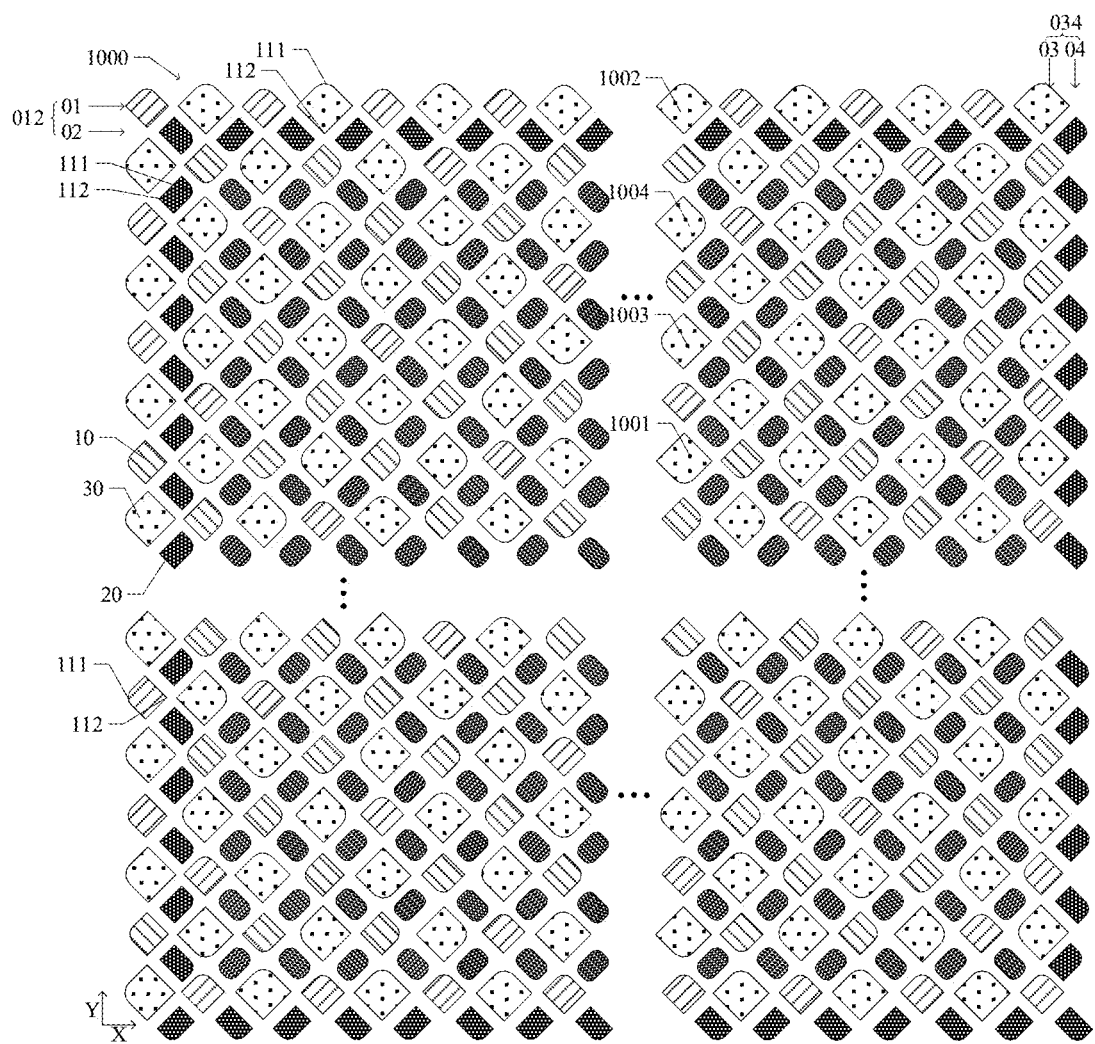
FIG. 20 is a partial planar structural view of a pixel arrangement in a display substrate provided by another example of the embodiment of the present disclosure.

For example, FIG. 20 is a partial planar structural view of pixel arrangement in a display substrate provided by another example of the embodiment of the present disclosure. The example shown in FIG. 20 differs from the example shown in FIG. 11 in that the second sub-pixel 20 of at least one of the edge pixel row group and the edge pixel column group in the display region of the display substrate in the present example includes a first angle portion 111 and a second angle portion 112 opposite to each other, and the distance between the intersection of extension lines or tangents of two sides forming the first angle portion 111 and the center of the sub-pixel is greater than the distance between the intersection of two sides forming the second angle portion 112 or extension lines or tangents of the two sides forming the second angle portion 112 and the center of the sub-pixel.

For example, as shown in FIG. 20, each second sub-pixel 20 in the edge pixel row group 012 and the edge pixel column group 034 in the display region includes a first angle portion 111 and a second angle portion 112 having the above-mentioned relationship.

For example, as shown in FIG. 20, in the edge pixel row group 012, the second angle portion 112 of the second sub-pixel 20 is closer to the first pixel row 01 than the first angle portion 111 is, so that the brightness center of the second sub-pixel serving as a green sub-pixel is closer to the first pixel row; and in the edge pixel column group 034, the second angle portion 112 of the second sub-pixel 20 is closer to the first pixel column 03 than the first angle portion 111 is, so that the brightness center of the second sub-pixel, which is located at the edge of the display region and serves as a green sub-pixel, is closer to the first pixel column to further alleviate the problem that the edge appears purple or blue when the display region of the display substrate is displaying.

For example, as shown in FIG. 20, in the present example, the second sub-pixel 20 located in the non-edge region of the display region may not include the first angle portion and the second angle portion having the above-mentioned relationship, that is, the shapes of the four vertex angles included in the second sub-pixel 20 located in the non-edge region of the display region are all the same.

In the present example, a green corner sub-pixel is provided at the intersection position of the second pixel row and the second pixel column in the edge pixel row group and the edge pixel column group, and the green corner sub-pixel can have the same features as the corner sub-pixel included in the first sub-pixels or the third sub-pixels, and details will not be repeated here.

In the present example, the shapes and arrangement rules of the first sub-pixels and the third sub-pixels in the edge and non-edge region of the display region can be the same as the shapes and arrangement rules of the first sub-pixels and the third sub-pixels in any one of the examples shown in FIGS. 1-19, and details will not be repeated here.

Figure 21:
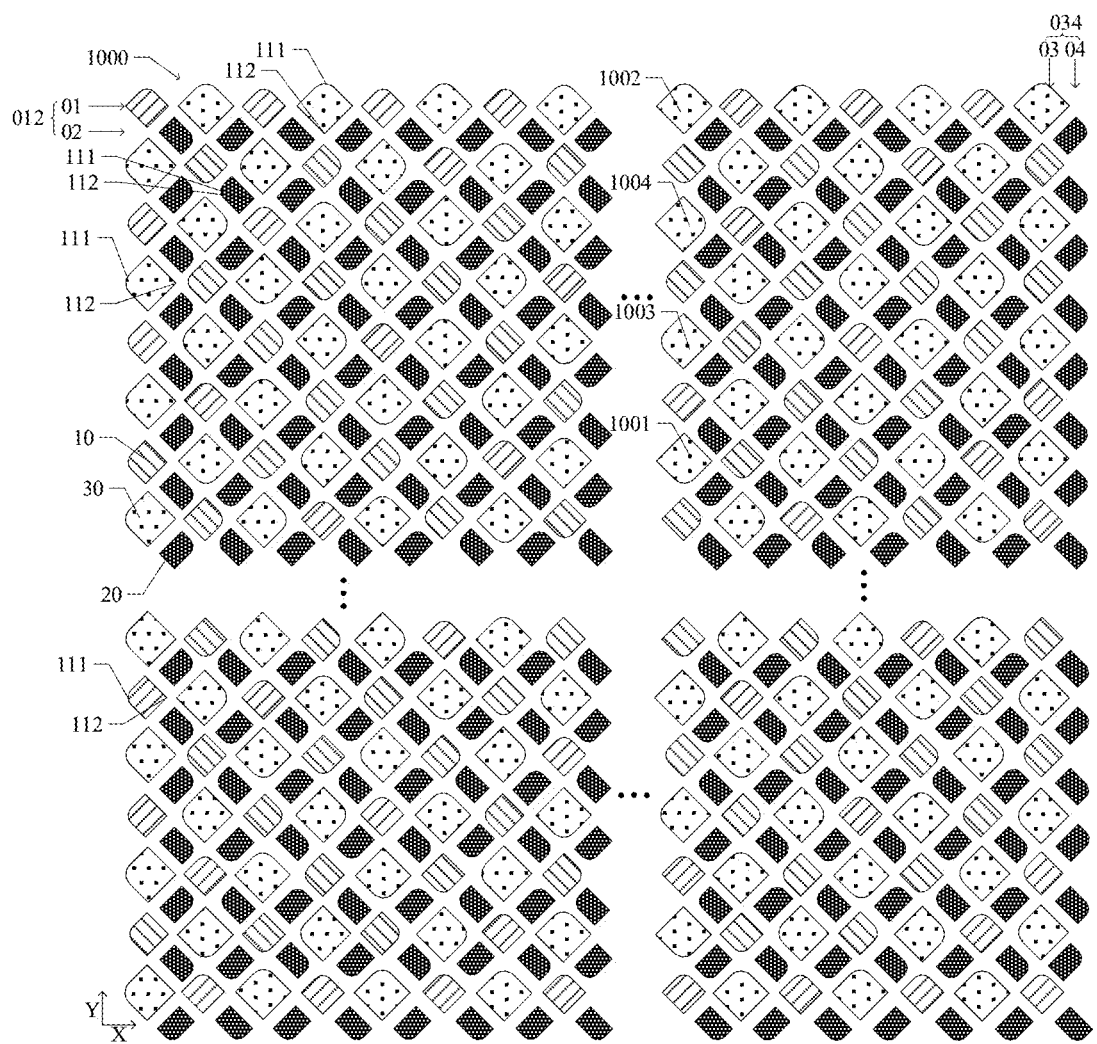
FIG. 21 is a partial planar structural view of a pixel arrangement in a display substrate provided by another example of the embodiment of the present disclosure.

For example, FIG. 21 is a partial planar structural view of pixel arrangement in a display substrate provided by another example of the embodiment of the present disclosure. The example shown in FIG. 21 differs from the example shown in FIG. 20 in that the second sub-pixel 20 in the non-edge region of the display region in the display substrate in the present example includes a first angle portion 111 and a second angle portion 112 opposite to each other, and the distance between the intersection of extension lines or tangents of two sides forming the first angle portion 111 and the center of the sub-pixel is greater than the distance between the intersection of two sides forming the second angle portion 112 or extension lines or tangents of the two sides forming the second angle portion 112 and the center of the sub-pixel.

For example, as shown in FIG. 21, the second sub-pixels 20 can also be divided into a first type sub-pixel, a second type sub-pixel, a third type sub-pixel and a fourth type sub-pixel according to the direction in which the first angle portion 111 points to the second angle portion 112. The definition manner of the four types of sub-pixels here is the same as the definition manner of the four types of sub-pixels shown in FIG. 1, but in the present example, the direction in which the first angle portion points to the second angle portion in each type of sub-pixels is no longer parallel to the row direction or the column direction. As shown in FIG. 21, the second sub-pixels 20 arranged along the row direction include two types of sub-pixels alternately arranged, the second sub-pixels 20 arranged along the column direction include the other two types of sub-pixels alternately arranged, the four second sub-pixels 20 surrounding the first sub-pixel include four types of sub-pixels, and the four second sub-pixels 20 surrounding the third sub-pixel include four types of sub-pixels.

The embodiments of the present disclosure are not limited to this case. The second sub-pixels arranged along the row direction can also include four types of sub-pixels, and the second sub-pixels arranged along the column direction can also include four types of sub-pixels.

Of course, in the present example, the shapes and arrangement rules of the first sub-pixels and the third sub-pixels in the edge and non-edge region of the display region can be the same as the shapes and arrangement rules of the first sub-pixels and the third sub-pixels in any one of the examples shown in FIGS. 1-19, and details will not be repeated here.

An embodiment of the present disclosure provides a display substrate. As shown in FIG. 1 and FIG. 6, the display substrate includes a plurality of sub-pixels 100, and the plurality of sub-pixels 100 include a plurality of first sub-pixels 10, a plurality of second sub-pixels 20 and a plurality of third sub-pixels 30; the plurality of first sub-pixels 10 and the plurality of third sub-pixels 30 are alternately arranged along the row direction (X direction as shown in FIG. 1) and the column direction (Y direction as shown in FIG. 1) to form a plurality of first pixel rows 01 and a plurality of first pixel columns 03, the plurality of second sub-pixels 20 are arrayed along the row direction and the column direction to form a plurality of second pixel rows 02 and a plurality of second pixel columns 04, the plurality of first pixel rows 01 and the plurality of second pixel rows 02 are alternately arranged along the column direction, and the plurality of first pixel columns 03 and the plurality of second pixel columns 04 are alternately arranged along the row direction. The row direction is intersected with the column direction. For example, the row direction and the column direction can be perpendicular to each other. The row direction and the column direction can be interchanged.

As shown in FIG. 1, taking the centers of a certain first sub-pixel 10 and a certain third sub-pixel 30 adjacent to each other in the first pixel row 01, and the centers of one first sub-pixel 10 and one third sub-pixel 30, which are respectively adjacent to the certain first sub-pixel and the certain third sub-pixel adjacent to each other along the column direction, as four vertices of a virtual quadrilateral 101, one second sub-pixel 20 is arranged in the virtual quadrilateral 101.

For example, the center of the sub-pixel is, for example, the geometric center of the sub-pixel, or the intersection of the perpendicular bisectors of sides of the sub-pixel, or the point in the sub-pixel with an approximately equal vertical distance to each side. Of course, the center of the sub-pixel can be allowed to have a certain error. For example, the center of the sub-pixel can be any point within a radius of 3 μm around the geometric center of the sub-pixel.

As shown in FIG. 1, each first pixel row 01 includes a first axis A1 extending along the row direction, and the plurality of first axes A1 in the plurality of first pixel rows 01 are equally spaced; each first pixel column 03 includes a second axis A2 extending along the column direction, and the plurality of second axes A2 in the plurality of first pixel columns 03 are equally spaced. Each sub-pixel includes a light emitting region 110. In at least one of the first sub-pixel 10 and the third sub-pixel 30, the light emitting region 110 is divided into a first part B1 and a second part B2 by one of the first axis A1 and the second axis A2, and is divided into a third part B3 and a fourth part B4 by the other of the first axis A1 and the second axis A2. The area of the first part B1 is less than the area of the second part B2, and the area of the third part B3 is the same as the area of the fourth part B4. At least one of the first sub-pixel 10 and the third sub-pixel 30 includes a first type sub-pixel 1001, a second type sub-pixel 1002, a third type sub-pixel 1003 and a fourth type sub-pixel 1004. In terms of different types of sub-pixels, the arrangement directions of the first part B1 and the second part B2 are different, and in terms of the first type sub-pixel 1001, the second type sub-pixel 1002, the third type sub-pixel 1003 and the fourth type sub-pixel 1004, the arrangement directions of the first part B1 and the second part B2 are a first direction D1, a second direction D2, a third direction D3 and a fourth direction D4, respectively. The first direction D1 is opposite to the second direction D2, and the third direction D3 is opposite to the fourth direction D4. The arrangement direction of the first part B1 and the second part B2 refers to the direction in which the center of the first part points to the center of the second part.

For example, the shapes of the first part B1 and the second part B2 are different, and the shapes of the third part B3 and the fourth part B4 are the same.

The four types of sub-pixels here are the same as the four types of sub-pixels in the display substrate shown in FIG. 1, and the arrangement direction of the first part B1 and the second part B2 here is the direction in which the vertex of the first angle portion points to the vertex of the second angle portion in the display substrate shown in FIG. 1.

It should be noted that the description related to the display substrate provided by any of the above examples shown in FIGS. 1-13 is applicable to the display substrate here, and the description of the structure and technical effects will not be repeated here.

Another embodiment of the present disclosure provides a display device, which includes the display substrate.

For example, the display device provided by the embodiments of the present disclosure can be a light emitting diode display device.

For example, the display device can further include a cover plate located on a display side of the display substrate.

For example, the display device can be any product or component with display function, such as a TV, a digital camera, a mobile phone, a watch, a tablet computer, a notebook computer, a navigator, etc., and the embodiments are not limited thereto.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

What have been described above are only specific implementations of the present disclosure, and the protection scope of the present disclosure is not limited thereto. Therefore, the protection scope of the present disclosure should be determined based on the protection scope of the claims.

What is claimed is:

1. A display substrate, comprising:
a plurality of sub-pixels, comprising a plurality of first sub-pixels, a plurality of second sub-pixels and a plurality of third sub-pixels; wherein the plurality of first sub-pixels and the plurality of third sub-pixels are alternately arranged along a row direction and a column direction to form a plurality of first pixel rows and a plurality of first pixel columns, the plurality of second sub-pixels are arrayed along the row direction and the column direction to form a plurality of second pixel rows and a plurality of second pixel columns, the plurality of first pixel rows and the plurality of second pixel rows are alternately arranged along the column direction, and the plurality of first pixel columns and the plurality of second pixel columns are alternately arranged along the row direction; taking centers of a certain first sub-pixel and a certain third sub-pixel adjacent to each other in a same first pixel row, and centers of one first sub-pixel and one third sub-pixel, which are in an adjacent first pixel row and are respectively adjacent to the certain first sub-pixel and the certain third sub-pixel adjacent to each other along the column direction, as four vertices of a virtual quadrilateral, one second sub-pixel is arranged in the virtual quadrilateral;
wherein the plurality of sub-pixels comprise a plurality of light emitting regions; in at least one kind of the first sub-pixels, the second sub-pixels and the third sub-pixels, vertex angles of the light emitting region comprise a first angle portion and a second angle portion which are oppositely arranged, and a distance between an intersection of extension lines or tangents of two sides constituting the first angle portion and a center of the sub-pixel is greater than a distance between an intersection of two sides constituting the second angle portion or extension lines or tangents of the two sides constituting the second angle portion and the center of the sub-pixel;
the at least one kind of the first sub-pixels, the second sub-pixels and the third sub-pixels comprise a first type sub-pixel and a second type sub-pixel; in terms of different types of sub-pixels, directions in which a vertex of the first angle portion points to a vertex of the second angle portion are different; in the first type sub-pixel and the second type sub-pixel, the directions in which the vertex of the first angle portion points to the vertex of the second angle portion are a first direction and a second direction, respectively, and the first direction is opposite to the second direction;
wherein the at least one kind of the first sub-pixels, the second sub-pixels and the third sub-pixels further comprise a third type sub-pixel and a fourth type sub-pixel;
wherein the first sub-pixels and the second sub-pixels are alternately arranged along an extending direction of a first diagonal line of the virtual quadrilateral, and the third sub-pixels and the second sub-pixels are alternately arranged along an extending direction of a second diagonal line of the virtual quadrilateral;
sub-pixels arranged along the extending direction of one of the first diagonal line and the second diagonal line comprise a plurality of third pixel groups; each of the plurality of third pixel groups comprises four first sub-pixels and four second sub-pixels, or four third sub-pixels and four second sub-pixels; and each of the plurality of third pixel groups comprises the first type sub-pixel, the second type sub-pixel, the third type sub-pixel and the fourth type sub-pixel.

2. The display substrate according to claim 1, wherein in the third type sub-pixel and the fourth type sub-pixel, the directions in which the vertex of the first angle portion points to the vertex of the second angle portion are a third direction and a fourth direction, respectively, and the third direction is opposite to the fourth direction.

3. The display substrate according to claim 2, wherein one of the first direction and the third direction is parallel to the row direction, and the other of the first direction and the third direction is parallel to the column direction; and/or
an included angle between the first direction and the third direction is in a range of 80-100 degrees.

4. The display substrate according to claim 2, wherein at least one of the plurality of first pixel rows comprises a plurality of first pixel groups, each of the plurality of first pixel groups comprises four first sub-pixels and four third sub-pixels, and each of the plurality of first pixel groups comprises the first type sub-pixel, the second type sub-pixel, the third type sub-pixel and the fourth type sub-pixel; and/or
at least one of the plurality of first pixel columns comprises a plurality of second pixel groups, each of the plurality of second pixel groups comprises four first sub-pixels and four third sub-pixels, and each of the plurality of second pixel groups comprises the first type sub-pixel, the second type sub-pixel, the third type sub-pixel and the fourth type sub-pixel.

5. The display substrate according to claim 1, wherein the first sub-pixel, the second sub-pixel and the third sub-pixel are sub-pixels emitting light of different colors.

6. The display substrate according to claim 1, wherein, in the at least one kind of the first sub-pixels, the second sub-pixels and the third sub-pixels, the vertex angles of the light emitting region further comprise a third angle portion and a fourth angle portion which are oppositely arranged; a connecting line between a vertex of the third angle portion and a vertex of the fourth angle portion divides the light emitting region into two parts, and shapes of the two parts are different; and/or an area of one part in which the first angle portion is located is less than an area of one part in which the second angle portion is located.

7. The display substrate according to claim 6, wherein a shape of at least one of the third angle portion and the fourth angle portion is approximately the same as a shape of the second angle portion, and a distance between the vertex of the first angle portion and the connecting line is less than a distance between the vertex of the second angle portion and the connecting line.

8. The display substrate according to claim 1, wherein the display substrate comprises at least one display region, one first pixel row and one second pixel row located at an outermost edge of the at least one display region and adjacent to each other constitute an edge pixel row group, and one first pixel column and one second pixel column located at the outermost edge of the at least one display region and adjacent to each other constitute an edge pixel column group, corner sub-pixels are arranged at an intersection position of the edge pixel row group and the edge pixel column group, and the corner sub-pixels comprise the first sub-pixel and the third sub-pixel;
in the edge pixel row group, at least one kind of the first sub-pixels and the third sub-pixels other than the corner sub-pixels comprises the first angle portion and the second angle portion, and the second angle portion is closer to the second pixel row than the first angle portion is; and/or in the edge pixel column group, at least one kind of the first sub-pixels and the third sub-pixels other than the corner sub-pixels comprises the first angle portion and the second angle portion, and the second angle portion is closer to the second pixel column than the first angle portion is.

9. The display substrate according to claim 8, wherein, in the edge pixel row group, both of the first sub-pixels and the third sub-pixels other than the corner sub-pixels comprise the first angle portion and the second angle portion, and in the edge pixel column group, both of the first sub-pixels and the third sub-pixels other than the corner sub-pixels comprise the first angle portion and the second angle portion.

10. The display substrate according to claim 1, wherein the first angle portion comprises a rounded angle or a flat angle, and the second angle portion comprises a rounded angle;
a radius of curvature of the rounded angle of the first angle portion is greater than a radius of curvature of the rounded angle of the second angle portion.

11. A display device, comprising the display substrate according to claim 1.

12. The display substrate according to claim 4, wherein sub-pixels arranged along the extending direction of the other of the first diagonal line and the second diagonal line comprise a plurality of fourth pixel groups; each of the plurality of fourth pixel groups comprises two first sub-pixels and two second sub-pixels, or two third sub-pixels and two second sub-pixels; and each of the plurality of fourth pixel groups comprises two types of sub-pixels among the first type sub-pixel, the second type sub-pixel, the third type sub-pixel and the fourth type sub-pixel.

13. The display substrate according to claim 12, wherein at least one kind of the first sub-pixels and the third sub-pixels comprises the first type sub-pixel, the second type sub-pixel, the third type sub-pixel and the fourth type sub-pixel; the first sub-pixel comprises a red sub-pixel, and the third sub-pixel comprises a blue sub-pixel.

14. The display substrate according to claim 13, wherein four third sub-pixels surrounding and adjacent to one first sub-pixel are the first type sub-pixel, the second type sub-pixel, the third type sub-pixel and the fourth type sub-pixel, respectively; and/or four first sub-pixels surrounding and adjacent to one third sub-pixel are the first type sub-pixel, the second type sub-pixel, the third type sub-pixel and the fourth type sub-pixel, respectively.

15. A display substrate, comprising:
a plurality of sub-pixels, comprising a plurality of first sub-pixels, a plurality of second sub-pixels and a plurality of third sub-pixels; wherein the plurality of first sub-pixels and the plurality of third sub-pixels are alternately arranged along a row direction and a column direction to form a plurality of first pixel rows and a plurality of first pixel columns, the plurality of second sub-pixels are arrayed along the row direction and the column direction to form a plurality of second pixel rows and a plurality of second pixel columns, the plurality of first pixel rows and the plurality of second pixel rows are alternately arranged along the column direction, and the plurality of first pixel columns and the plurality of second pixel columns are alternately arranged along the row direction; taking centers of a certain first sub-pixel and a certain third sub-pixel adjacent to each other in a same first pixel row, and centers of one first sub-pixel and one third sub-pixel, which are in an adjacent first pixel row and are respectively adjacent to the certain first sub-pixel and the certain third sub-pixel adjacent to each other along the column direction, as four vertices of a virtual quadrilateral, one second sub-pixel is arranged in the virtual quadrilateral;
wherein the plurality of sub-pixels comprise a plurality of light emitting regions, the display substrate comprises at least one display region, and in at least one of the first sub-pixel and the third sub-pixel in the first pixel row and the first pixel column at an outermost edge of the at least one display region, vertex angles of the light emitting region comprise a first angle portion and a second angle portion which are oppositely arranged, and a distance between an intersection of extension lines or tangents of two sides constituting the first angle portion and a center of the sub-pixel is greater than a distance between an intersection of two sides constituting the second angle portion or extension lines or tangents of the two sides constituting the second angle portion and the center of the sub-pixel;
wherein at least one kind of the first sub-pixels, the second sub-pixels and the third sub-pixels comprise a first type sub-pixel, a second type sub-pixel, a third type sub-pixel and a fourth type sub-pixel;
wherein the first sub-pixels and the second sub-pixels are alternately arranged along an extending direction of a first diagonal line of the virtual quadrilateral, and the third sub-pixels and the second sub-pixels are alternately arranged along an extending direction of a second diagonal line of the virtual quadrilateral;
sub-pixels arranged along the extending direction of one of the first diagonal line and the second diagonal line comprise a plurality of third pixel groups; each of the plurality of third pixel groups comprises four first sub-pixels and four second sub-pixels, or four third sub-pixels and four second sub-pixels; and each of the plurality of third pixel groups comprises the first type sub-pixel, the second type sub-pixel, the third type sub-pixel and the fourth type sub-pixel.

16. The display substrate according to claim 15, wherein one first pixel row and one second pixel row located at the outermost edge of the at least one display region and adjacent to each other constitute an edge pixel row group, and one first pixel column and one second pixel column located at the outermost edge of the at least one display region and adjacent to each other constitute an edge pixel column group, corner sub-pixels are arranged at an intersection position of the edge pixel row group and the edge pixel column group, and the corner sub-pixels comprise the first sub-pixel and the third sub-pixel;
in the edge pixel row group, in sub-pixels other than the corner sub-pixels, the second angle portion is closer to the second pixel row than the first angle portion is; and/or in the edge pixel column group, in sub-pixels other than the corner sub-pixels, the second angle portion is closer to the second pixel column than the first angle portion is.

17. The display substrate according to claim 16, wherein, in the edge pixel row group, both of the first sub-pixels and the third sub-pixels other than the corner sub-pixels comprise the first angle portion and the second angle portion, and in the edge pixel column group, both of the first sub-pixels and the third sub-pixels other than the corner sub-pixels comprise the first angle portion and the second angle portion.

18. A display substrate comprising:
a plurality of sub-pixels, comprising a plurality of first sub-pixels, a plurality of second sub-pixels and a plurality of third sub-pixels; wherein the plurality of first sub-pixels and the plurality of third sub-pixels are alternately arranged along a row direction and a column direction to form a plurality of first pixel rows and a plurality of first pixel columns, the plurality of second sub-pixels are arrayed along the row direction and the column direction to form a plurality of second pixel rows and a plurality of second pixel columns, the plurality of first pixel rows and the plurality of second pixel rows are alternately arranged along the column direction, and the plurality of first pixel columns and the plurality of second pixel columns are alternately arranged along the row direction; taking centers of a certain first sub-pixel and a certain third sub-pixel adjacent to each other in a same first pixel row, and centers of one first sub-pixel and one third sub-pixel, which are in an adjacent first pixel row and are respectively adjacent to the certain first sub-pixel and the certain third sub-pixel adjacent to each other along the column direction, as four vertices of a virtual quadrilateral, one second sub-pixel is arranged in the virtual quadrilateral;
wherein the plurality of first pixel rows comprise a plurality of first axes extending along the row direction, and the plurality of first axes in the plurality of first pixel rows are equally spaced; the plurality of first pixel columns comprise a plurality of second axes extending along the column direction, and the plurality of second axes in the plurality of first pixel columns are equally spaced;
the plurality of sub-pixels comprise a plurality of light emitting regions; in at least one kind of the first sub-pixels and the third sub-pixels, the light emitting region is divided into a first part and a second part by one of the first axis and the second axis, and is divided into a third part and a fourth part by the other of the first axis and the second axis; an area of the first part is less than an area of the second part, and an area of the third part is the same as an area of the fourth part;
at least one kind of the first sub-pixels and the third sub-pixels comprises a first type sub-pixel and a second type sub-pixel; in terms of different types of sub-pixels, directions in which a center of the first part points to a center of the second part are different; in the first type sub-pixel and the second type sub-pixel, the directions in which the center of the first part points to the center of the second part are a first direction and a second direction, respectively, and the first direction is opposite to the second direction;
wherein the at least one kind of the first sub-pixels and the third sub-pixels further comprises a third type sub-pixel and a fourth type sub-pixel; in the third type sub-pixel and the fourth type sub-pixel, directions in which the center of the first part points to the center of the second part are a third direction and a fourth direction, respectively, and the third direction is opposite to the fourth direction.

* * * * *